(12) United States Patent  
Soeda et al.

(10) Patent No.: US 9,320,154 B2
(45) Date of Patent: Apr. 19, 2016

(54) METHOD OF MANUFACTURING AN INTERLAYER CONNECTION SUBSTRATE

(71) Applicant: HITACHI, LTD., Tokyo (JP)

(72) Inventors: Akira Soeda, Tokyo (JP); Chiko Yorita, Tokyo (JP); Shinichirou Tooya, Tokyo (JP); Takayuki Ono, Tokyo (JP); Mitsuru Takahira, Tokyo (JP); Yuuichi Sekino, Tokyo (JP); Akira Goto, Tokyo (JP); Yoshimasa Tashiro, Tokyo (JP); Hiroyuki Doi, Tokyo (JP); Tsutomu Sakamoto, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 14/287,242

(22) Filed: May 27, 2014

(65) Prior Publication Data

US 2014/0353018 A1 Dec. 4, 2014

(30) Foreign Application Priority Data

May 28, 2013 (JP) .................................. 2013-111786

(51) Int. Cl.
*H05K 3/20* (2006.01)
*H05K 3/46* (2006.01)
(Continued)

(52) U.S. Cl.
CPC ............ *H05K 3/4614* (2013.01); *H05K 1/113* (2013.01); *H05K 1/114* (2013.01); *H05K 3/0094* (2013.01);
(Continued)

(58) Field of Classification Search
CPC ... H05K 3/4614; H05K 3/462; H05K 3/4623; H05K 4/429; H05K 1/113; H05K 1/114; H05K 3/0094; H05K 3/306; H05K 2201/044; H05K 2201/09881; H05K 2201/099; H05K 2201/10189; H05K 2201/10234; H05K 2203/061; H05K 2203/063; H05K 2201/0959; Y10T 29/49128; Y10T 29/49455; Y10T 29/49165
USPC ............ 29/830, 831, 846, 852; 174/255, 259, 174/262
See application file for complete search history.

(56) References Cited

U.S. PATENT DOCUMENTS 4,780,957 A * 11/1988 Shiga .................. H05K 3/4623
29/852
5,031,308 A * 7/1991 Yamashita ............. H05K 3/462
29/830

(Continued)

FOREIGN PATENT DOCUMENTS

JP 5-7082 A 1/1993
JP 7-321437 A 12/1995

(Continued)

OTHER PUBLICATIONS

Japanese Office Action received in corresponding Japanese Application No. 2013-111786 dated Sep. 8, 2015.

*Primary Examiner* — Donghai D Nguyen
(74) *Attorney, Agent, or Firm* — Mattingly & Malur, PC

(57) ABSTRACT

An electrode connected to a TH pad requiring electric conduction is formed on a bonded surface of a first multilayer substrate having piercing TH to form a solder bump on the electrode. An electrode connected to the TH pad is formed on a bonded surface of a second multilayer substrate to be bonded having a piercing TH at a position opposite the electrode formed on the first multilayer substrate to form a solder bump on the electrode. A three-layered sheet is formed by applying an adhesive as a resin material that is not completely cured to both surfaces of a core material as the cured resin, and has holes at positions corresponding to the TH and the solder bump, respectively. The first and the second multilayer substrates are then laminated having the bonded surfaces facing each other while having the three-layered sheet positioned and interposed therebetween, and batch thermocompression bonded.

14 Claims, 26 Drawing Sheets

(51) Int. Cl.
*H05K 1/11* (2006.01)
*H05K 3/00* (2006.01)
*H05K 3/30* (2006.01)

(52) U.S. Cl.
CPC .......... *H05K 3/306* (2013.01); *H05K 2201/044* (2013.01); *H05K 2201/099* (2013.01); *H05K 2201/0959* (2013.01); *H05K 2201/09881* (2013.01); *H05K 2201/10189* (2013.01); *H05K 2201/10234* (2013.01); *H05K 2203/061* (2013.01); *H05K 2203/063* (2013.01); *Y10T 29/49165* (2015.01)

(56) References Cited

U.S. PATENT DOCUMENTS

| | | | |
|---|---|---|---|
| 6,175,087 B1 * | 1/2001 | Keesler | H05K 3/429 174/262 |
| 6,742,247 B2 * | 6/2004 | Pai | H05K 3/462 29/846 |
| 2003/0012004 A1 | 1/2003 | Uehara | |
| 2003/0174484 A1 | 9/2003 | Pai et al. | |
| 2007/0289706 A1 | 12/2007 | Nakagawa et al. | |
| 2009/0168367 A1 | 7/2009 | Fujii | |

FOREIGN PATENT DOCUMENTS

| | | |
|---|---|---|
| JP | 2001-236458 A | 11/2001 |
| JP | 2002-246745 A | 8/2002 |
| JP | 2003-23258 A | 1/2003 |
| JP | 2005-19483 A | 1/2005 |
| JP | 2005-116811 A | 4/2005 |
| JP | 2005-520333 A | 7/2005 |
| JP | 2007-335701 A | 12/2007 |
| JP | 2009-158742 A | 7/2009 |
| JP | 2011-159855 A | 8/2011 |
| JP | 2011-228516 A | 11/2011 |

* cited by examiner

FIG. 3A
FIG. 3B
FIG. 3C
FIG. 3D
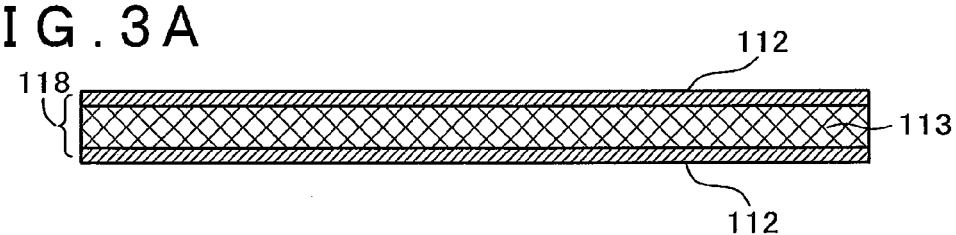
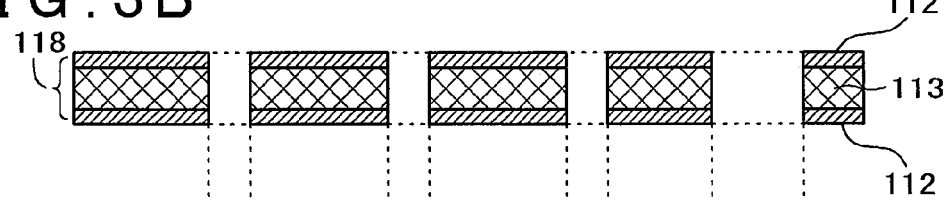
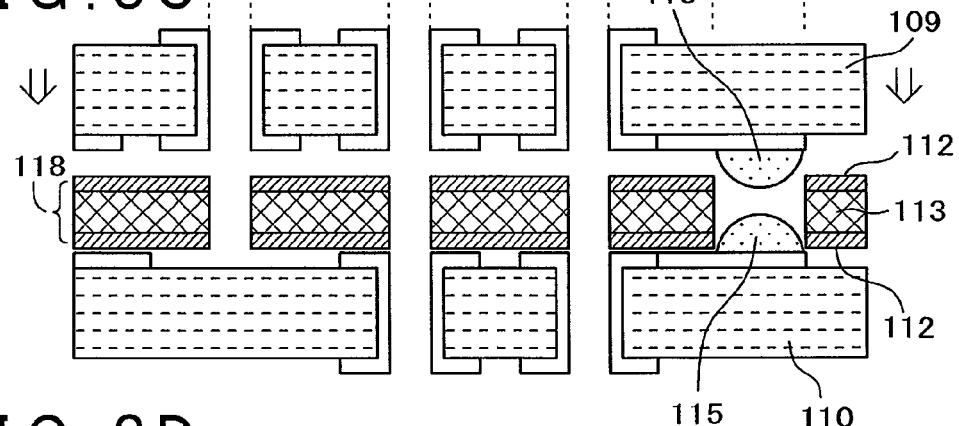
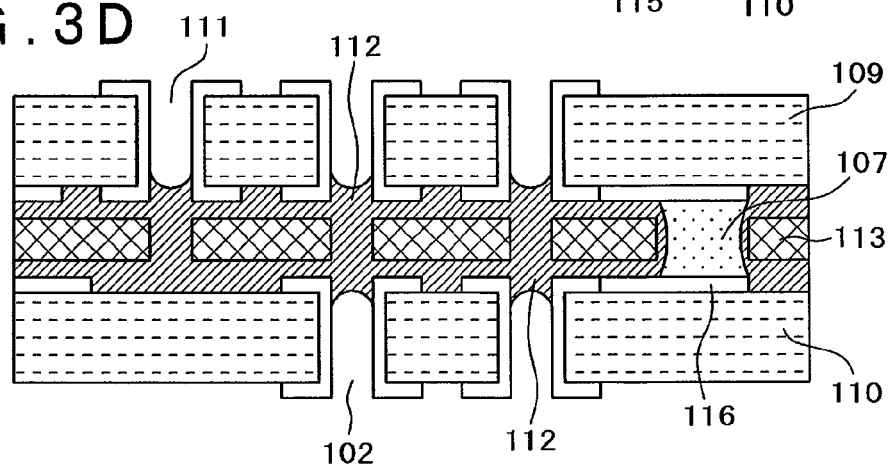

A-A' CROSS SECTION

B-B' CROSS SECTION

C-C' CROSS SECTION

D-D' CROSS SECTION

E-E' CROSS SECTION

F-F' CROSS SECTION

G-G' CROSS SECTION

H-H' CROSS SECTION

METHOD OF MANUFACTURING AN INTERLAYER CONNECTION SUBSTRATE

CLAIM OF PRIORITY

The present application claims priority from Japanese application serial no. JP2013-111786, filed on May 28, 2013, the content of which is hereby incorporated by reference into this application.

BACKGROUND OF THE INVENTION

1. Field of the Invention

The present invention relates to a multilayer printed substrate employed for an information processing device, and a method of manufacturing an interlayer connection substrate at reduced cost.

2. Description of Related Arts

The recent trend of high operation rate of the interface such as the communication apparatus has resulted in an increase in both capacity and operation rate in the band for data transfer of the information processing devices, for example, routers, servers, RAID and the like, which has been doubled in the last three years. The transmission rate of the backplane at 10 Gbps has been put into practical application, and is expected to reach 25 Gbps for the next generation. It is therefore the pressing need to achieve high density of the server and cope with the high transmission rate of a midplane inside the rack. It is also highly demanded to realize the high density packaging of the module such as the blade connected to the midplane of the next mass production server with a press-fit connector.

FIG. 8 schematically illustrates the device structured to have mutual signal transmission via the midplane inside the server casing. For example, a server blade 105 is connected to the surface of the midplane, and a management module 106, a switch module, a fan module, a power supply module unit and the like are connected to the back surface of the midplane (FIG. 8 only shows the management module 106 as a representative example). The midplane 101 is a multilayer printed substrate including 24 layers, which is electrically coupled with the respective devices via a press-fit connector 103. The press-fit connector 103 is structured to achieve the electric coupling by inserting a spring-type press-fit connector pin 104 into a piercing through hole 102 (hereinafter referred to as a piercing TH) of the midplane 101. The generally employed structure has the single piercing TH occupied with the pin inserted from one side, and accordingly, the press-fit connectors are arranged to be positionally shifted mutually. However, as the number of types of the press-fit connector increases, and the density of the blade mounting is getting higher, arrangement flexibility has been demanded so as to allow arrangement of the press-fit connectors from both surfaces of the midplane.

In order to manufacture the substrate for both-surface press-fit connection through the generally employed process for forming the printed substrate such as sequential lamination for meeting the demand, the problem of increased process steps and higher costs is unavoidable. It is the urgent need to develop the technique for bonding both surfaces of the substrate, which allows electric coupling at an arbitrary position by bonding the multilayer substrates having the piercing THs. In other words, the adhesive layer having the conductive material such as solder buried is inserted among plural multilayer substrates for batch thermocompression bonding. This method allows adhesion and electric coupling between the multilayer substrates to be simultaneously conducted. The substrate manufactured through the aforementioned method will be referred to as the interlayer connection substrate.

Japanese Unexamined Patent Application Publication No. 2005-116811 discloses that the high-rate wiring board formed of the material selected to have the large cross-section area of the signal line, and the relatively low conductivity of the insulation layer, and the high-density wiring board formed of the material selected to have the relatively small cross-section area of the signal line, and the relatively high conductivity of the insulation layer are individually manufactured to cope with the high frequency in excess of 1 GHz, and high density component packaging at low cost. The thus manufactured wiring boards are bonded with the adhesive insulation sheet having through-vias preliminarily formed for interlayer connection so as to manufacture the multilayer wiring circuit substrate.

Japanese Unexamined Patent Application Publication No. 2001-326458 discloses that the individual supporting body for forming the wiring patterns are bonded with the prepreg (provided by preliminarily forming a via hole in the insulation substrate with adhesive layers on both surfaces, and filling the via hole with the conductive paste) to manufacture the multilayer wiring circuit substrate.

In order to apply the manufacturing processes as disclosed in Japanese Unexamined Patent Application Publication Nos. 2005-116811 and 2001-326458 to the midplane with mounted press-fit connector, it is necessary to overcome various problems, for example, preventing intrusion of the resin to the through hole (hereinafter referred to as TH) for the press-fit connector. It is therefore difficult to realize the application. Japanese Patent Application No. 2012-151288 discloses the technique as the solution for the aforementioned problem. The disclosed method of bonding the multilayer substrates uses the three-layered resin sheet having the adhesive layers pasted on both surfaces of the core layer with cured plastic material, and the Cu core solder plating ball. The present invention provides the technique for realizing the manufacturing of the interlayer connection substrate mounted with the press-fit connector at lower costs.

SUMMARY OF THE INVENTION

The problems caused by applying the aforementioned interlayer connection substrate to the server midplane will be described hereinafter.

The first problem will be described. Each of a large number of press-fit connectors to be mounted on the server midplane is structured to achieve electric coupling by press fitting the spring-type pin of the connector with the copper plating TH to mechanically bring metals in contact and connection with each other. When applying the interlayer connection substrate to the server midplane, electric connection failure may be caused by the resin of the adhesive layer intruding into the TH interferes with insertion of the connector pin, or the resin on the copper plating TH surface even if insertion of the connector pin is successful. In this case, the high-precision drilling process has to be added to remove the resin that has intruded into the TH. Such restriction as the machining precision (hole shape accuracy) of the drill for ensuring the plating thickness of the TH, and the relative hole positional accuracy is too severe to allow manufacturing. Furthermore, increased process steps cause the cost increase. Even if the TH allows the resin intrusion, there may still be the problem of overflowing the intruding resin in the hole with small diameter to the substrate surface.

The second problem will be described. The void in the printed substrate worsens variation in the characteristic impedance of the signal wring, and causes ion migration. It is therefore necessary to prevent degradation in long-term reliability of the substrate. Reduction in the pressing force when the resin with low fluidity and bonding is required for suppressing the resin intrusion into the TH as described above. As the flow rate of the resin of the adhesive layer decreases, the resin is not filled into the stepped portion between the copper foil pattern and the substrate surface to be bonded, resulting in failure in the form of the void.

The third problem will be described. If the pin of the press-fit connector reaches or pierces through the interlayer connection portion of the interlayer connection substrate, the electrode for electric coupling has to be drawn from the TH and arranged. In the case where the generally employed method for electrically coupling the upper and lower substrates through the plated TH, there are many discontinuous points in the conductive part of the adhesive layer and the pad drawer part of the bonded surface, which may cause the problem of deteriorating the signal transmission characteristic under the influence of the electrostatic capacity between the drawing line and the inner layer voltage plane.

The fourth problem will be described. Among the methods of burying the conductive material in the adhesive layer, the one for printing the solder paste has caused the problem of the shape failure of the interlayer connection portion in addition to the aforementioned problems. The pressing force in the bonding process step allows the resin of the adhesive layer to force the conductive material away to cause abnormality or opening in the shape of the interlayer connection portion. This has caused the problem of reducing reliability and yield of the substrate.

The present invention provides the method of manufacturing the interlayer connection substrate with high density, high transmission quality and high quality at a low cost.

The present invention provides a method of manufacturing an interlayer connection substrate which includes providing an electrode connected to a pad for a TH, requiring electric conduction on a bonded surface of a first multilayer substrate to be bonded having a piercing TH to form a solder bump on the electrode, providing an electrode connected to a pad for a TH on a bonded surface of a second multilayer substrate to be bonded having a piercing TH at a position opposite the electrode formed on the first multilayer substrate to form a solder bump on the electrode, forming holes in a three-layered sheet derived from applying an adhesive as a resin material that is not completely cured to both surfaces of a core material as a cured resin at positions corresponding to the THs and the solder bumps on the electrodes, respectively, and disposing the first and the second multilayer substrates having the respective bonded surfaces facing each other, which are laminated while having the three-layered sheet positioned and interposed therebetween, and batch thermocompression bonded through a process of heating and pressing under a vacuum environment.

The present invention is configured that the bonded surfaces of the first and the second multilayer substrates are planarized by applying solder resists and executing a process of exposure and developing, and a hole is formed in the three-layered sheet at a position corresponding to the TH, which has a diameter larger than a diameter of the TH.

The present invention is configured that an electrode connected to the pad for the TH is formed on a first bonded surface of a third multilayer substrate to be bonded having the piercing TH at a position opposite the electrode formed on a substrate as an upper layer to be bonded to the third substrate to form the solder bump on the electrode, and an electrode connected to the pad for the TH is formed on a second bonded surface of the third multilayer substrate at a position opposite the electrode formed on a substrate as a lower layer to be bonded to the third multilayer substrate to form the solder bump on the electrode. An electrode connected to the pad for the TH is formed on a bonded surface of the second multilayer substrate having the piercing TH at a position opposite the electrode formed on the third multilayer substrate to form the solder bump on the electrode. The first and the second multilayer substrates, and one or more third multilayer substrates are provided having the respective bonded surfaces facing each other, and the three-layered sheets are positioned and laminated between the substrates, which are batch thermocompression bonded through a process of heating and pressing under an evacuated environment.

The present invention provides an interlayer connection substrate which includes a first multilayer substrate to be bonded, which has a piercing TH, an electrode formed on a pad for a TH requiring electric conduction, an interlayer connection portion formed in the electrode, and the bonded surface bonded to one surface of a three-layered resin substrate, a second multilayer substrate to be bonded, which has a piercing TH, an electrode connected to the pad for the TH on the bonded surface at a position opposite the electrode formed on the first multilayer substrate to be bonded, an interlayer connection portion formed in the electrode, and the bonded surface bonded to a back surface of the three-layered resin substrate, and the interlayer connection portion is selected from one of a solder connection portion, a solder connection portion having a metal ball as a core, and a solder connection portion having a pillar as the core.

Advantages of the representative examples of the present invention will be briefly described.

The prevention of the resin intrusion into the TH in the step of manufacturing the interlayer connection substrate ensures application of the interlayer connection substrate to the both-surface press-fit connector mount substrate. This makes it possible to produce the substrate which allows high density packaging of the press-fit connector at the cost lower than the generally employed approach.

BRIEF DESCRIPTION OF THE DRAWINGS

FIGS. 3A to 3D represent manufacturing process steps of a three-layered sheet of an adhesive layer between the multilayer substrates according to the first embodiment of the present invention, and bonding the multilayer substrates;

FIGS. 14A and 14B represent an example of solder connection failure which may occur in the connected portion at the narrow pitch of the interlayer connection substrate, wherein FIG. 14A is a sectional view taken along line A-A' for horizontally cutting the area where the THs and the interlayer connection portions densely exist at the center of the core material between the bonded substrates, and FIG. 14B is a sectional view taken along line B-B' for vertically cutting the entire interlayer connection substrate;

FIGS. 15A and 15B represent a dummy hole structure formed in the three-layered sheet according to a sixth embodiment of the present invention, wherein FIG. 15A is a sectional view taken along line C-C' for horizontally cutting the region where the THs and the interlayer connection portions densely exist at the center of the core material between the bonded substrates, and FIG. 15B is a sectional view taken along line D-D' for vertically cutting the entire interlayer connection substrate;

FIGS. 16A and 16B represent the structure formed by hollowing the three-layered sheet below the connector area according to a seventh embodiment of the present invention, wherein FIG. 16A is a sectional view taken along line E-E' for cutting the region where the THs and the interlayer connection portions densely exist at the center of the core material between the bonded substrates, and FIG. 16B is a sectional view taken along line F-F' for vertically cutting the entire interlayer connection substrate;

FIGS. 25A and 25B represent an example of the structure that applies the interlayer connection of the substrate requiring a high-rate signal wiring according to a thirteenth embodiment of the present invention as the substrate with the structure having the ground layer that is the closest to the electrode on the upper and the lower multilayer substrates subjected to the hollowing process, wherein FIG. 25A is a sectional view taken along line G-G' for horizontally cutting the region where the THs and the interlayer connection portions densely exist at the center of the core material between the bonded substrates, and FIG. 25B is a sectional view taken along line H-H' for vertically cutting the entire interlayer connection substrate;

DETAILED DESCRIPTION OF THE PREFERRED EMBODIMENTS

Figure 1:
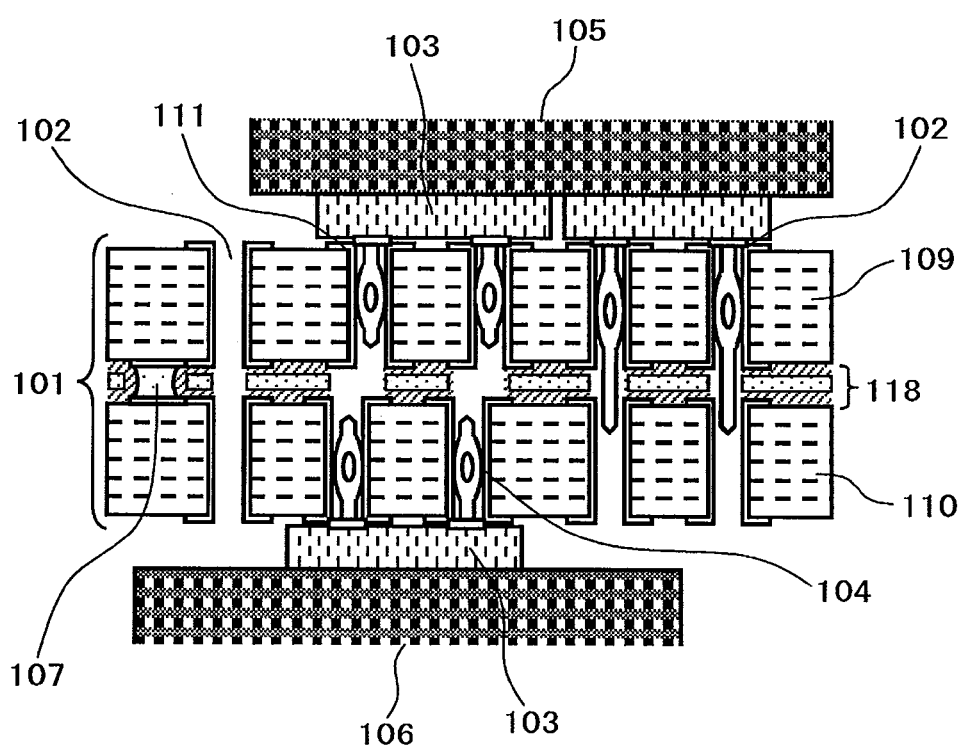
FIG. 1 is a sectional view of an interlayer connection substrate according to a first embodiment of the present invention.

Embodiments of the present invention will be described referring to the drawings.

First Embodiment

A first embodiment of the present invention will be described referring to FIGS. 1, 2A, 2B, 3A to 3D, 6A to 6D, and 7A to 7D.

FIG. 1 is a sectional view of an interlayer connection substrate 101 according to the first embodiment. An upper multilayer printed wiring board 109 and a lower multilayer printed wiring board 110 are bonded via an adhesive layer 118, and are electrically coupled with an interlayer connection portion 107. Since a non-piercing through hole 111 (hereinafter referred to as a non-piercing TH) may be formed in both surfaces of the substrate, it is possible to mount press-fit connectors 103 on the upper surface and back surface of the substrate, respectively. Positions of the through holes (hereinafter referred to as THs) formed in the upper multilayer printed wiring board 109 and the lower multilayer printed wiring board 110 are aligned to ensure formation of a piercing TH 102.

A method of manufacturing the interlayer connection substrate shown in FIG. 1 will be described referring to FIGS. 2A, 2B, and 3A to 3D.

Figure 2A:
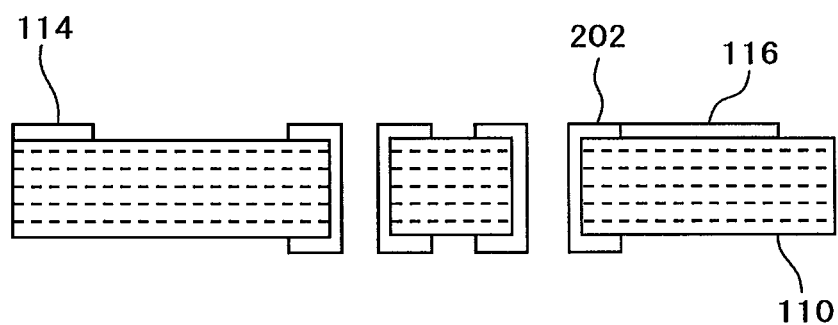
FIGS. 2A and 2B represent pretreatment process steps of a multilayer substrate to be bonded according to the first embodiment.
Figure 2B:
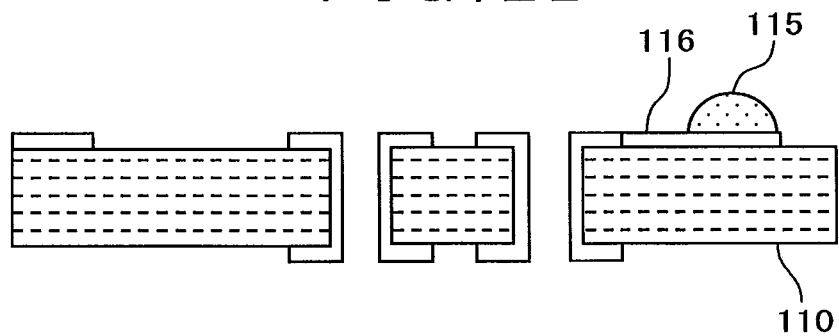

FIGS. 2A and 2B represent pretreatment process steps of the multilayer printed wiring board to be bonded. FIG. 2A illustrates the multilayer printed wiring board 110 to be bonded. An electrode 116 that is preliminarily connected to a pad 202 of the TH is disposed at the point which is required to be electrically conducted between the upper and lower substrates to be bonded together so that they face each other. A copper foil pattern except the electrode 116 on the bonded surface is subjected to a surface roughening process such as the neo-brown process. Then a solder paste is printed on the electrode 116 as illustrated in FIG. 2B to form a solder bump 115 through reflow of the substrate.

FIGS. 3A and 3B represent the manufacturing process steps of the three-layered sheet for the adhesive layer between the multilayer substrates. As FIG. 3A shows, sheets as prepreg materials 112 are applied to interpose the upper and lower surfaces of a core material 113, which are compression bonded through the press. The resultant product will be referred to as a three-layered sheet 118.

The prepreg material 112 is a B-stage material (the material in the middle of the resin curing stage in the condition that is not completely cured) derived from impregnating the glass fiber in the thermosetting resin that exhibits low fluidity. The core material 113 is a C-stage material (the material in the resin curing stage in substantially a complete cured state) derived from etching out Cu bonded onto both surfaces of the laminated substrate.

As FIG. 3B illustrates, the three-layered sheet is drilled at the positions corresponding to the TH and the interlayer connection portion 107 of the interlayer connection substrate 101 to have holes each with the same diameter as that of the TH of the substrate, or the diameter of the interlayer connection portion at the positions of the TH of the interlayer connection substrate 101 and the interlayer connection portion 107.

As FIG. 3C illustrates, the lower multilayer printed wiring board 110, the three-layered sheet 118, and the upper multilayer printed wiring board 109 are disposed in this order in a vacuum thermocompression bonding device while being guided with a positioning pin, which are subjected to thermocompression bonding under the evacuated environment to provide the structure illustrated in FIG. 3D (in the thermocompression bonding process step in the vacuum thermocompression bonding device, the resin of the prepreg material 112 is melted, and flows to fill the gap between the multilayer substrates, and is cured as FIG. 3D illustrates. FIG. 3D volumetrically expresses in a rather enlarged way).

When applying the above-structured substrate 101 to the press-fit mount substrate such as the midplane, the TH for mounting the press-fit connector requires to be drilled for resin removal.

The thermocompression bonding process is characterized in that the substrate interposed between given plates of the vacuum thermocompression bonding device is evacuated, and the pressure is applied and heated while controlling magnitude of the pressure and timing. The temporary pressing is performed until the solder is melted at the temperature of the process equal to or higher than the melting point of the solder. Thereafter, a main pressing is performed so that the gap between the multilayer substrates is filled with the resin. The substrates are connected in the aforementioned order to allow the solder to have the highly reliable connection shape such as columnar-like shape, spherical shape and hourglass-like shape.

Figure 6A:
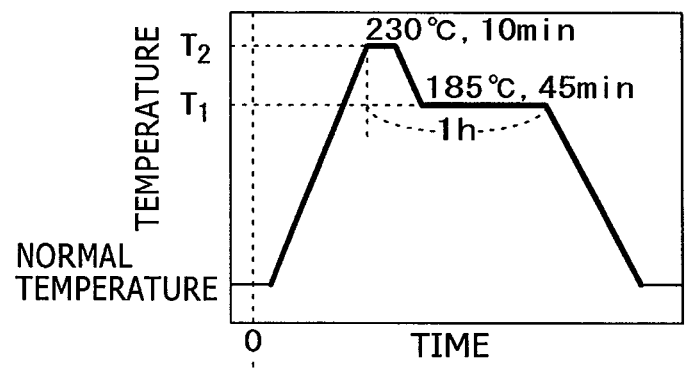
FIGS. 6A to 6D represent changes in a vacuum press/heating-pressurizing process in the multilayer substrate bonding process step at the solder melting point higher than the resin curing temperature, and the respective timings.
Figure 6B:
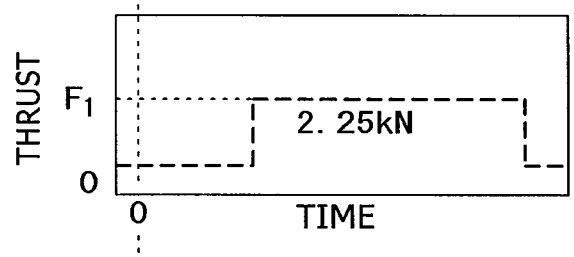
Figure 6C:
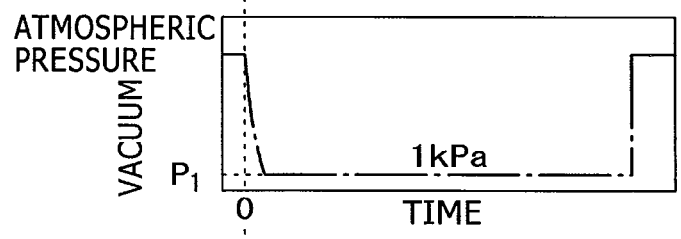
Figure 6D:
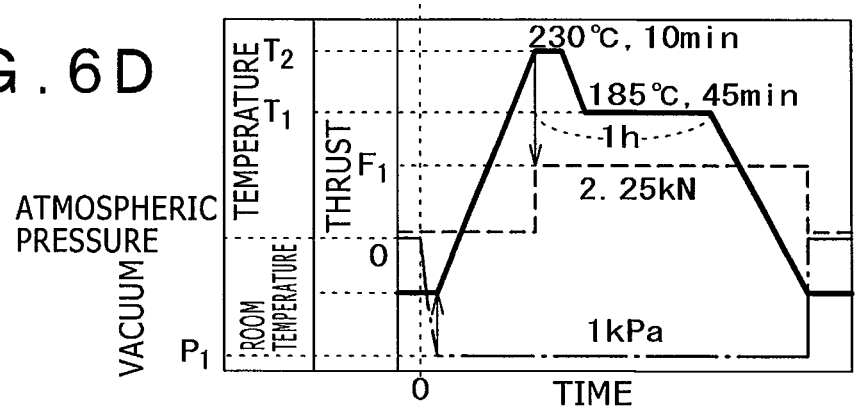

FIGS. 6A to 6D represent press conditions for the solder of Sn-3Ag-0.5Cu at the melting point of the solder material higher than the resin curing temperature. In this case, the composition of the used solder has Sn-3Ag-0.5Cu through the vacuum press/thermosetting process at the solder melting point (217° C.) higher than the resin curing temperature. FIG. 6A represents the temperature change with respect to time. FIG. 6B represents change in the thrust of the press with respect to time. FIG. 6C represents change in the pressure within the chamber with respect to time when the chamber that contains the substrate is evacuated. FIG. 6D represents respective changes in the temperature (FIG. 6A), thrust (FIG. 6B), and pressure (FIG. 6C) altogether.

After evacuating the chamber, heating is started. The temperature is gradually increased until it is equal to or higher than the melting point of Sn-3Ag-0.5Cu solder. Thereafter, the press is started to fill the resin at the thrust of $F_1$. The state is held at the temperature equal to or higher than the solder melting point $T_2$:Tmax=230° C. for approximately 10 minutes, and the temperature is decreased to the temperature $T_1$ suitable for curing the resin. This state is held for required hours. Then the temperature of the chamber/jig is decreased approximately to the room temperature, and the pressure is returned to the atmospheric pressure for releasing the press. The respective timings are shown in FIG. 6D. It is preferable to apply the press before the end of resin curing. Referring to the profile of the vacuum heating press used for the present embodiment, highly reliable solder connection shape may be obtained at appropriate timings for solder wetting extendability, softening and inflow of the heated prepreg impregnated resin.

As the solder-forming material, Sn—Ag—Cu-base (low Ag base), Sn—Cu base, Sn—Ag—Bi base, Sn—In base, Sn—Zn base, Pb-free solder, Pb-containing solder and the like may be employed. The Sn base solder composition may include minute quantity of multiple additive elements besides those described above.

Figure 7A:
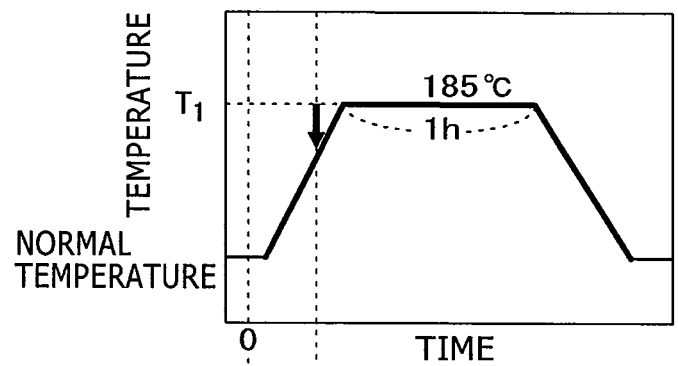
FIGS. 7A to 7D represent changes in the vacuum press/heating-pressurizing process in the multilayer substrate bonding process step at the solder melting point lower than the resin curing temperature, and the respective timings.
Figure 7B:
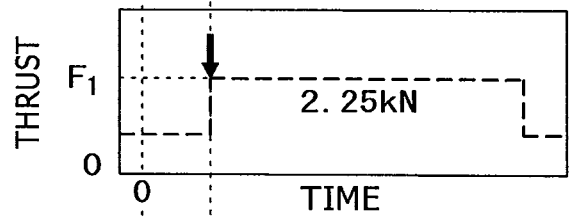
Figure 7C:
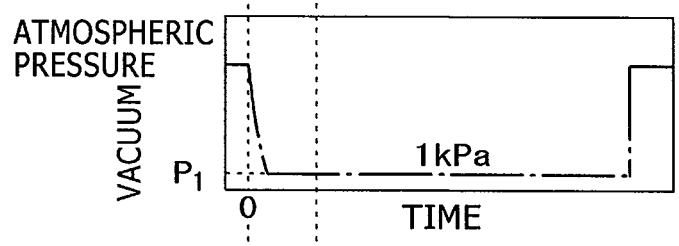
Figure 7D:
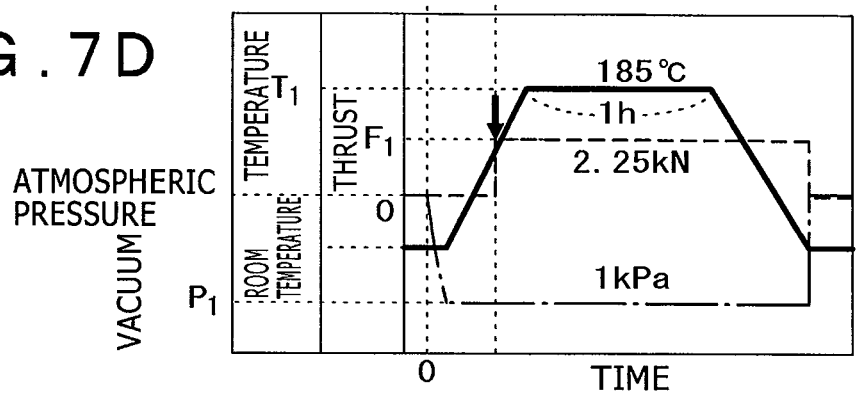
Figure 8:
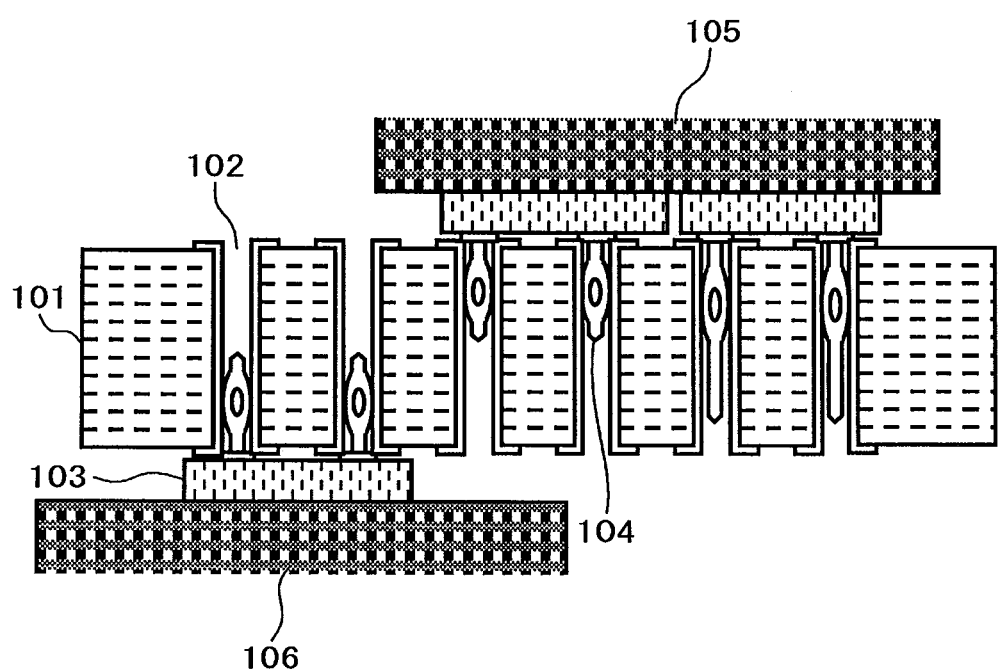
FIG. 8 is a schematic view of a part where the press-fit pin is inserted in a generally structured server midplane.

If the melting point of the solder material is lower than the resin curing temperature, the vacuum press/thermosetting process is executed as shown in FIGS. 7A to 7D when the solder composition contains Sn-58Bi at the melting point (138° C.), or Sn-1Ag-57Bi at the melting point (139° C.). FIG. 7A represents change in the temperature with respect to time. FIG. 7B represents change in the thrust of the press with respect to time. FIG. 7C represents change in the pressure within the chamber with respect to time when the chamber that contains the substrates is evacuated. FIG. 7D represents respective changes in the temperature (FIG. 7A), thrust (FIG. 7B), and pressure (FIG. 7C) altogether.

After evacuating the chamber, heating is started. The temperature is gradually increased until it is equal to or higher than the melting point of Sn-58Bi solder. Thereafter, the press is started to fill the resin at the thrust of $F_1$. As the resin curing temperature $T_1$ is equal to or higher than the solder melting point, the state is held at the temperature $T_1$:Tmax=185° C. for one hour. Thereafter, the temperature of the chamber/jig is decreased approximately to the room temperature, and the pressure is returned to the atmospheric pressure for releasing the press. The respective timings are shown in FIG. 7D. It is preferable to apply the press before the end of resin curing. Referring to the profile of the vacuum heating press used for the present embodiment, a highly reliable solder connection shape may be obtained at appropriate timings for solder wetting extendability, softening and inflow of the heated prepreg impregnated resin.

As the solder-forming material, Sn base, Sn—Bi base, Sn—Ag—Cu base, Sn—Ag base (including low Ag base with Ag content lower than 3.0 wt %), Sn—Cu base, Sn—Ag—Bi base, Sn—Zn base, Pb-free solder, Pb-containing solder and the like may be employed.

If the THs of the upper and the lower multilayer substrates 109, 110 to be bonded are formed at the same positions, they form the piercing TH 102. If they are formed at different positions, they form the non-piercing TH 111. The electric coupling between the upper and the lower multilayer substrates is realized by the interlayer connection portion 107 formed between the electrodes 116 of the upper and the lower multilayer substrates.

In comparison with the generally employed method using the Cu core solder plating ball for the interlayer connection portion 107, this example ensures to reduce the number of manufacturing process steps and the member cost.

Second Embodiment

Referring to FIGS. 4A to 4C and 5A to 5D, an embodiment will be described as the method of manufacturing the interlayer connection substrate as described in the first embodiment, to which the structure for preventing resin intrusion into the TH, and forming the void between the substrates is added.

Figure 4A:
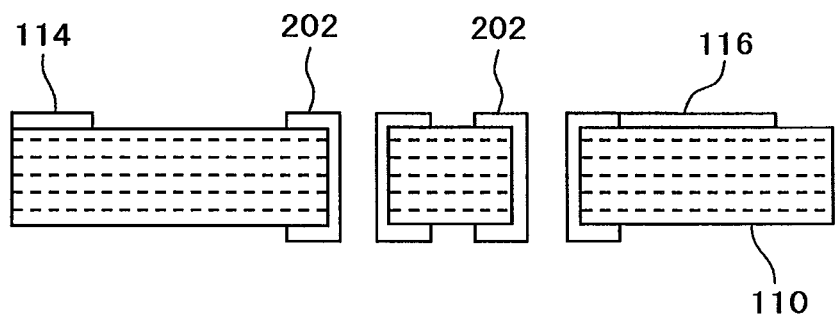
FIGS. 4A to 4C represent the pretreatment process steps of the multilayer substrate to be bonded according to a second embodiment of the present invention.
Figure 4B:
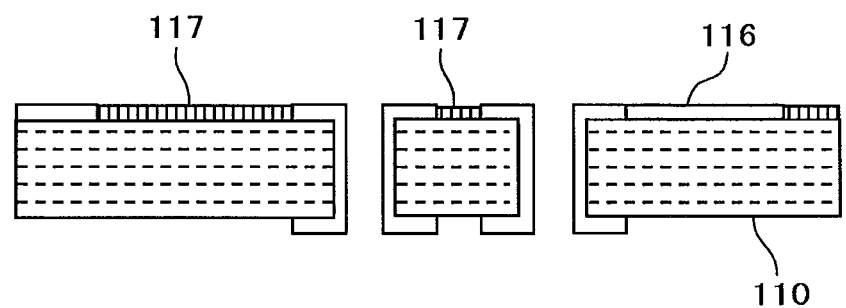
Figure 4C:
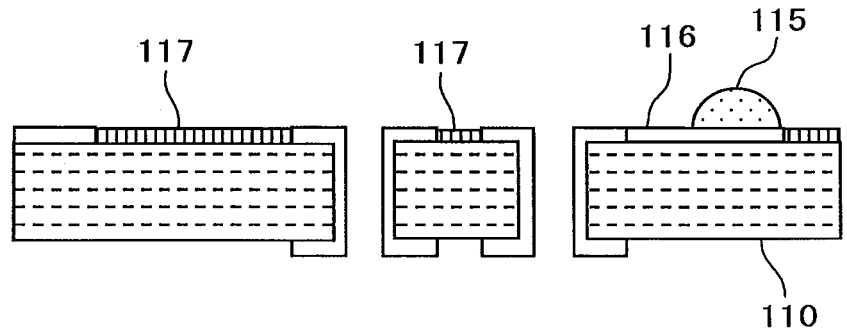

FIGS. 4A to 4C represent the pretreatment process steps of the multilayer printed wiring board as the bonded object.

FIG. 4A illustrates the multilayer printed wiring board 110 to be bonded. Each of the electrodes 116 connected to the pad 202 for the TH is preliminarily disposed at the point required to be electrically conducted between the upper and the lower multilayer substrates so that they face each other.

FIG. 4B represents a process step for planarizing the surface to be bonded. A liquid solder resist 117 with the same thickness as that of the copper foil pattern 114 is applied to the bonded surface of the substrate, and an exposure process is applied to such region as the copper foil pattern 114, the pad 202 for TH, and the electrode 116. The subsequent developing process melts to remove the solder resist pattern in such regions as the copper foil pattern 114, the pad 202 for TH, and the electrode 116. Then the pattern is formed so that the other region is filled with the solder resist 117 as FIG. 4B shows.

The surface roughening such as a neo-brown process (main component is hydrogen peroxide/sulfuric acid system, for example, and the surface area is increased by roughening the copper surface to improve adhesive force with the resin using the anchor effect) is performed to the copper foil pattern except the electrode 116 on the bonded surface and the pad for TH. Then the solder paste is printed on the electrode 116 to reflow the substrate so that the solder bump 115 is formed as FIG. 4C shows.

Figure 5A:
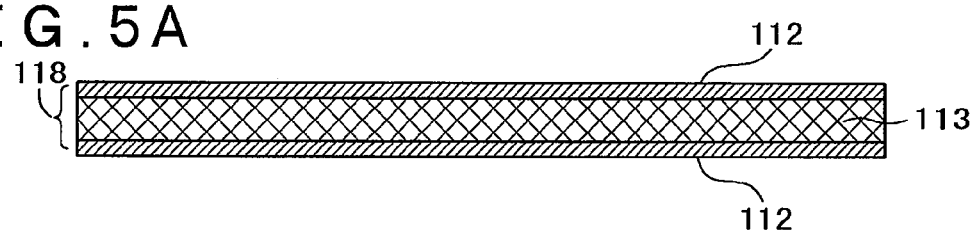
FIGS. 5A to 5D represent the process steps of manufacturing the three-layered sheet of the adhesive layer between the multilayer substrates according to the second embodiment of the present invention, and bonding the multilayer substrates.
Figure 5B:
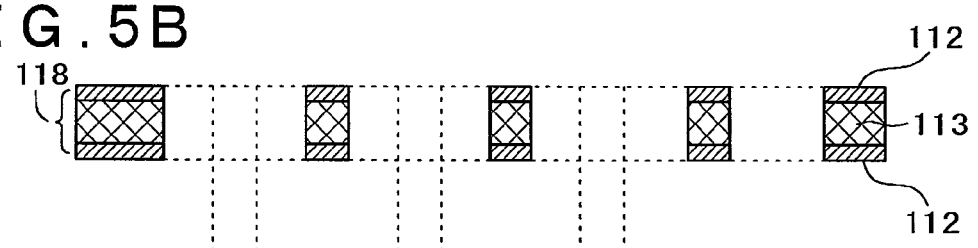

FIGS. 5A and 5B represent the process steps of manufacturing the three-layered sheet, to which the structure for preventing resin intrusion to the TH is added.

As FIG. 5A shows, the prepreg materials 112 are applied to the upper and the lower surfaces of the core material 113, which is compression bonded through the press. The prepreg material 12 is the B-stage material (the material in the middle of the resin curing stage in the condition that is not completely cured) derived from impregnating the glass fiber in the thermosetting resin that exhibits low fluidity. The core material is the C-stage material (the material in the resin curing stage in substantially a complete cured state) derived from etching out Cu bonded onto both surfaces of the laminated substrate.

As FIG. 5B illustrates, the three-layered sheet is drilled using the drill with the bore size larger than that of the substrate TH at the position of the TH of the interlayer connection substrate and the interlayer connection portion. This makes it possible to enhance the effect for preventing the prepreg material 112 which flows upon the thermocompression bonding of the substrate from intruding into the TH (never reach the inside of the TH) through which the press-fit pin is inserted.

It is preferable to drill the three-layered sheet while setting the bore size as large as possible in terms of design, for example, leaving the space of 0.1 mm from the adjacent hole for the purpose of providing the maximum intrusion prevention effect. In this case where the THs for insertion of the press-fit pins are formed at each pitch of 1.1 mm, the bore size of the three-layered sheet is set to 1.0 mm in accordance with the connector specification.

Figure 5C:
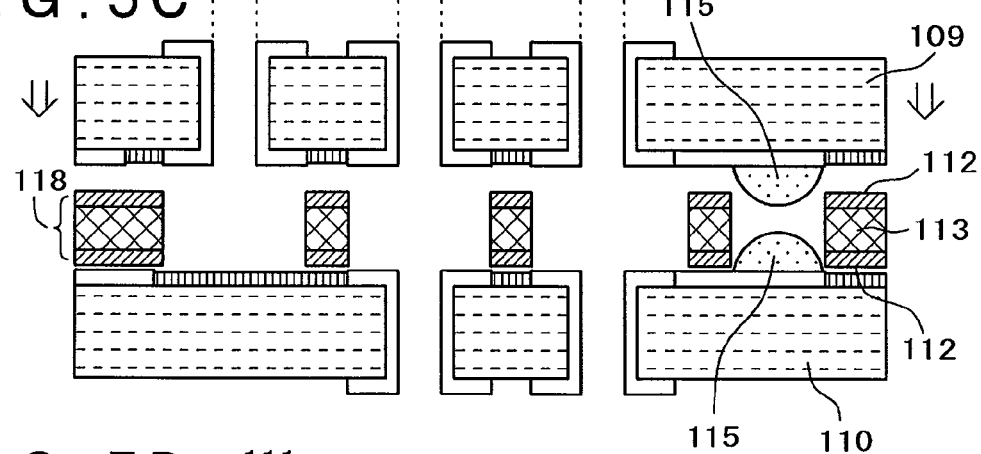
Figure 5D:
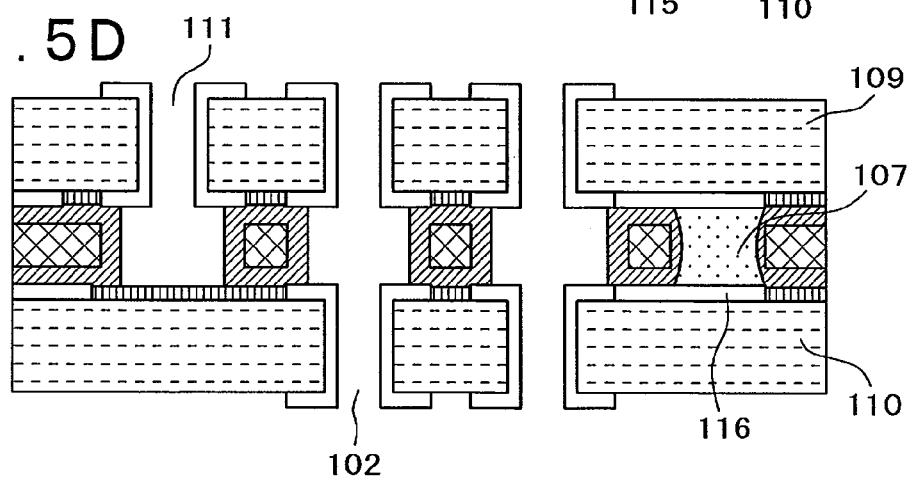

As FIG. 5C shows, the lower multilayer printed wiring board 110, the three-layered sheet 118, and the upper multilayer printed wiring board 109 are disposed in this order in the vacuum thermocompression bonding device while being guided with the positioning pin, which is thermocompression bonded under the evacuated environment to complete production of the interlayer connection substrate with the structure as illustrated in FIG. 5D. The thermocompression bonding process is characterized in that the substrate interposed between given plates of the vacuum thermocompressed bonding device is evacuated, and the pressure is applied and heated while controlling magnitude of the pressure and timing. The temporary pressing is performed until the solder is melted at the temperature of the process equal to or higher than the melting point of the solder as illustrated in the changes in FIGS. 6A to 7D. Thereafter, a main pressing is performed for filling the resin. The substrates are connected in the aforementioned order to allow the solder to have the highly reliable connection shape such as the columnar-like shape, spherical shape and hourglass-like shape.

If the THs of the upper and the lower multilayer substrates 109, 110 to be bonded are formed at the same positions, they form the piercing TH 102. If they are formed at different positions, they form the non-piercing TH 111. The electric coupling between the upper and the lower multilayer substrates is realized by the interlayer connection portion 107 formed between the electrodes 116 of the upper and the lower multilayer substrates.

The present embodiment is capable of preventing the resin intrusion into the THs, and generation of the void between the bonded substrates, which have been required to provide the solution. This makes it possible to allow application of the interlayer connection substrate to the press-fit mount substrate such as the midplane.

Third Embodiment

Referring to FIGS. 9A to 9C, and 10A to 10D, an explanation will be made with respect to an example derived from adding the structure for enhancing the resin intrusion prevention effect to the method of manufacturing the interlayer connection substrate as described in the second embodiment.

Figure 9A:
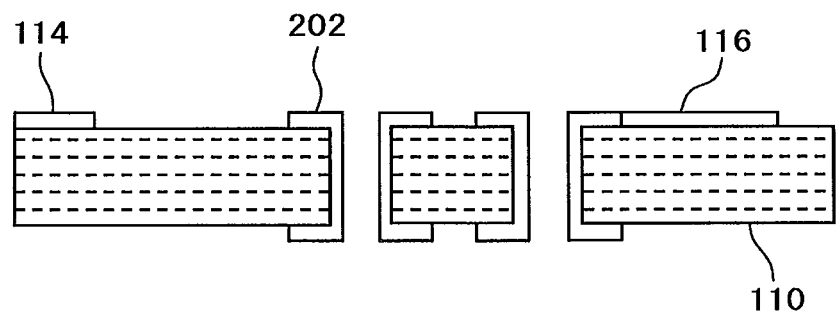
FIGS. 9A to 9C represent the pretreatment process steps of the multilayer substrate to be bonded according to a third embodiment of the present invention.
Figure 9B:
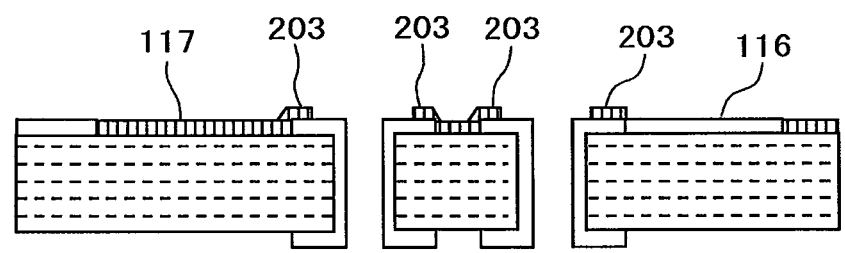
Figure 9C:
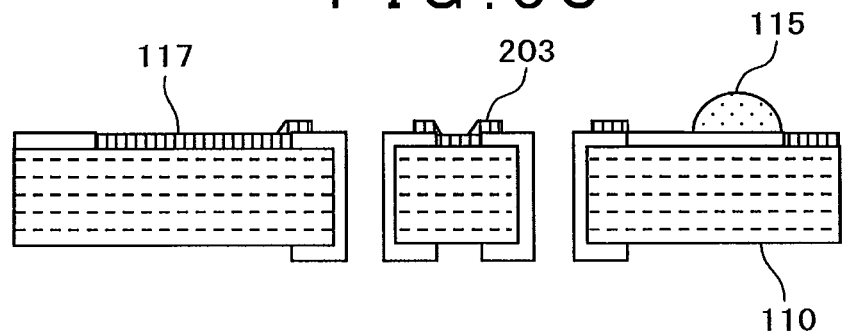

FIGS. 9A to 9C represent the pretreatment process steps of the multilayer printed wiring board to be bonded. FIG. 9A illustrates the multilayer substrate to be bonded. Like the second embodiment, the electrodes 116 are preliminarily disposed on the upper and the lower substrates at the points requiring conduction between the substrates so that they face each other.

FIG. 9B illustrates the solder resist pattern forming process step to the bonded surface. Like the second embodiment, when forming the solder resist pattern 117 through the process of exposure and developing so as to fill the gaps among those regions of the copper foil pattern 114, the pad 202 for TH, and the electrode 116 on the bonded surface, a solder resist 203 with a ring-like bank-shaped pattern to surround the opening of the TH on the TH pad 202. The solder resist pattern 117 and the solder resist 203 with the bank-shaped pattern are simultaneously formed through the single exposure and developing process.

The surface roughening such as the neo-brown process is performed to the copper foil pattern 114 except the electrode 116 on the bonded surface and the pad for TH. Then the solder paste is printed on the electrode 116 to reflow and heat the substrate so that the solder bump 115 is formed as FIG. 9C shows.

Figure 10A:
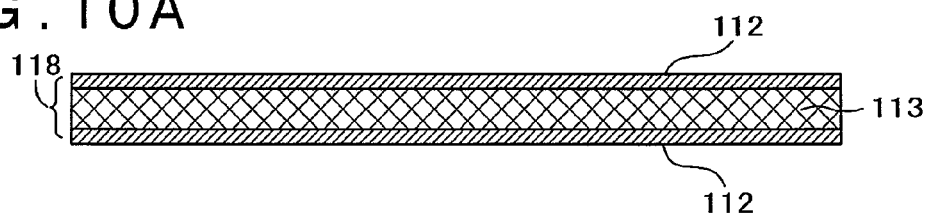
FIGS. 10A to 10D represent the process steps of manufacturing the three-layered sheet for the adhesive layer between the multilayer substrates, and bonding the multilayer substrates according to the third embodiment of the present invention.
Figure 10B:
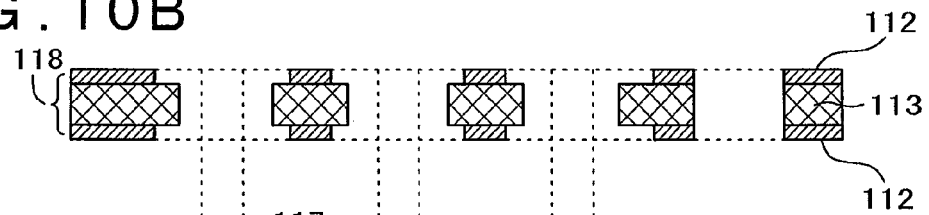

FIGS. 10A and 10B represent the manufacturing process steps of the three-layered sheet for adhesion between the multilayer substrates. As FIG. 10A illustrates, the core material 113 and the prepreg material 112 are drilled to form holes before temporary compression bonding so that the TH with respect to the prepreg material 112 has the diameter larger than that of the core material 113.

As FIG. 10B shows, the prepreg material and the core material are compression bonded with the press machine into the three-layered sheet while having the respective hole positions aligned.

Figure 10C:
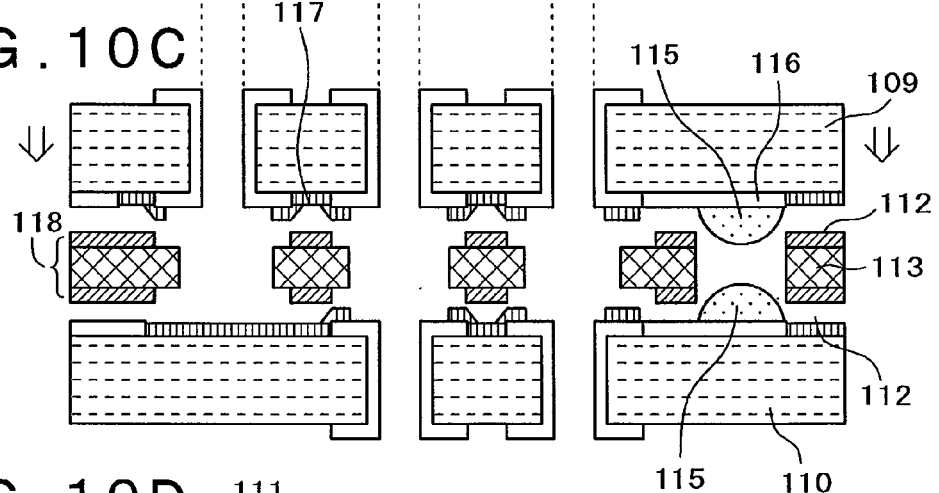
Figure 10D:
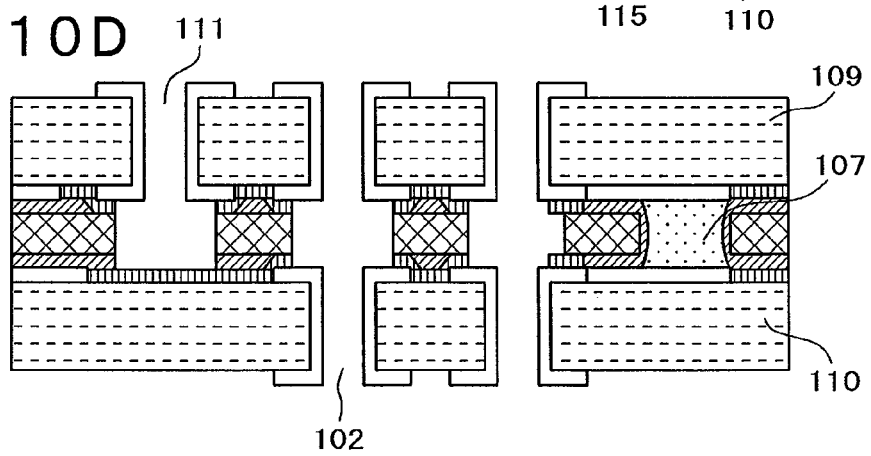

FIGS. 10C and 10D represent the substrate bonding process steps. As FIG. 10C shows, the lower multilayer printed wiring board 110, the three-layered sheet 118, and the upper multilayer printed wiring board 109 are disposed in this order in the vacuum thermocompression bonding device while being guided with the positioning pin, which is subjected to thermocompression bonding under the evacuated environment to provide the interlayer connection substrate with the structure as FIG. 10D shows.

In the thermocompression bonding process step, the peripheral area of the TH is surrounded by the solder resist 203 and the core material 113 formed in the process step illustrated in FIG. 9B without leaving the gap. This makes it possible to enhance the effect for preventing the resin intrusion into the TH.

Fourth Embodiment

Referring to FIGS. 11A to 12C, an explanation will be made with respect to the structure for enhancing the resin intrusion prevention effect using the method different from the one described in the third embodiment with respect to the manufacturing process of the interlayer connection substrate described in the second embodiment.

Figure 11A:
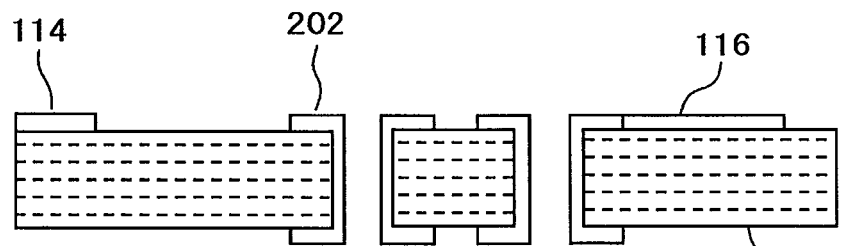
FIGS. 11A to 11D represent the pretreatment process steps of the multilayer substrate to be bonded according to a fourth embodiment of the present invention.
Figure 11B:
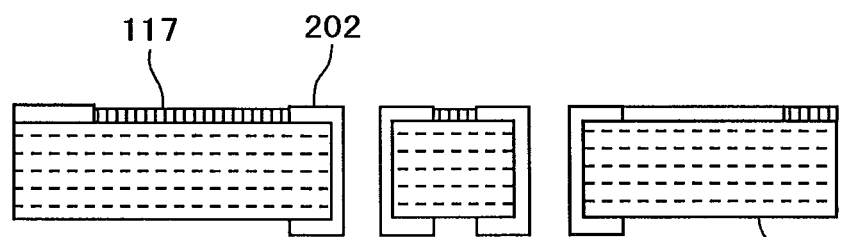

FIGS. 11A to 11D represent the pretreatment process steps of the multilayer printed wiring board to be bonded. Firstly, the surface to be bonded is planarized, and the pattern surface is roughened through the neo-brown process as shown in FIGS. 11A and 11B like the second and the third embodiments.

Figure 11C:
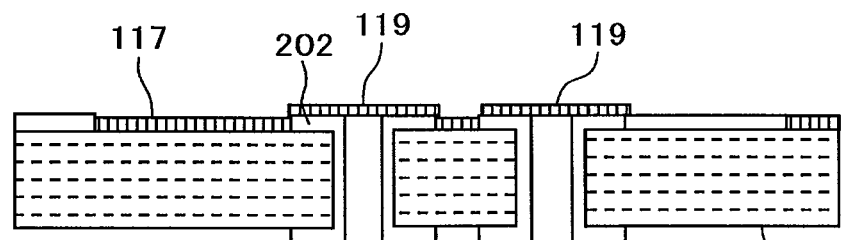

As FIG. 11C illustrates, a sheet type solder resist 119 with the film thickness of 35 μm or larger is bonded to the surface to be bonded to cover the TH through the process of exposure and developing.

Figure 11D:
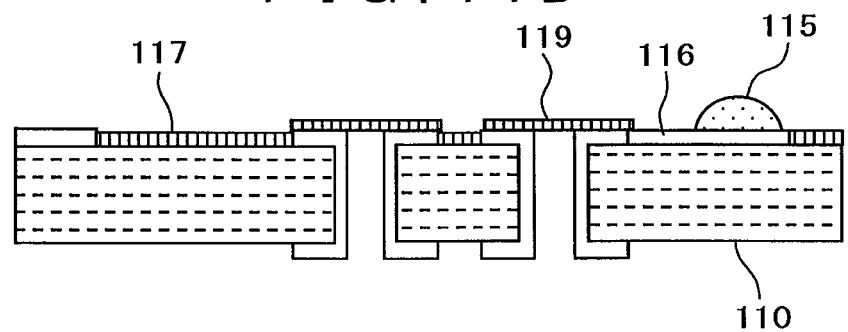

As FIG. 11D illustrates, the solder bump 115 is formed on the electrode 116 through the solder paste printing.

Figure 12A:
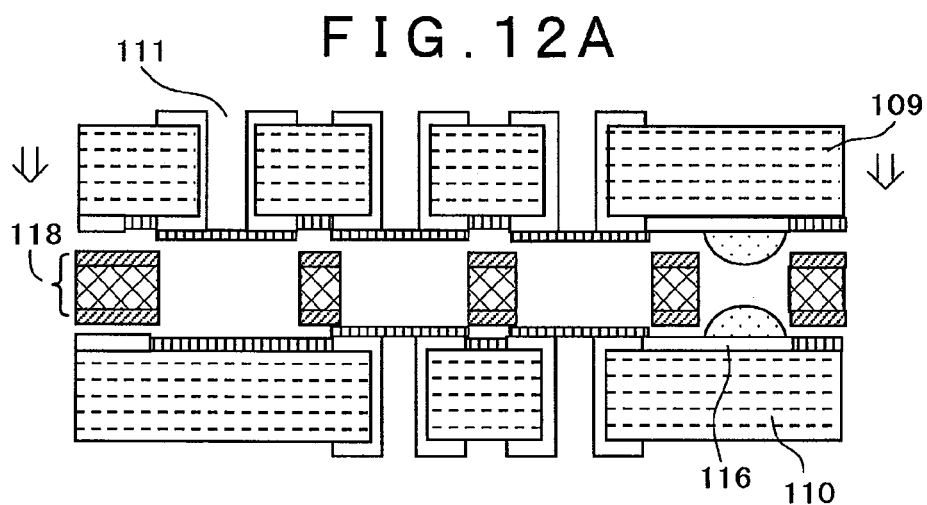
FIGS. 12A to 12C represent the bonding process steps of the multilayer substrates according to the fourth embodiment of the present invention.
Figure 12B:
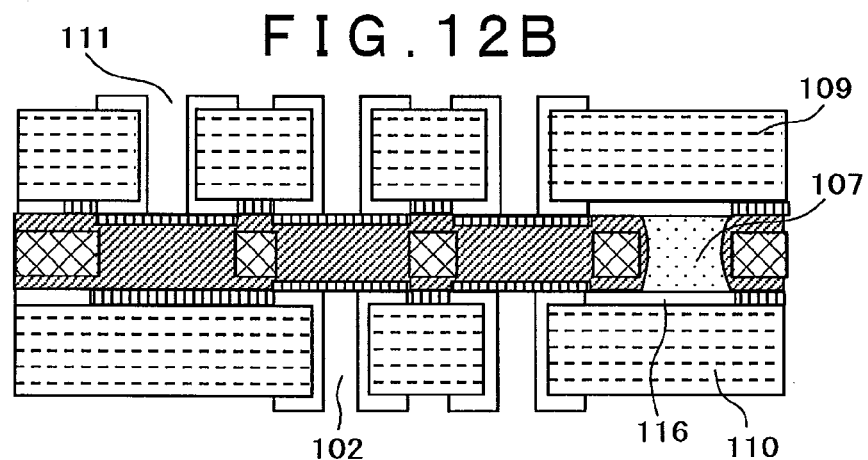
Figure 12C:
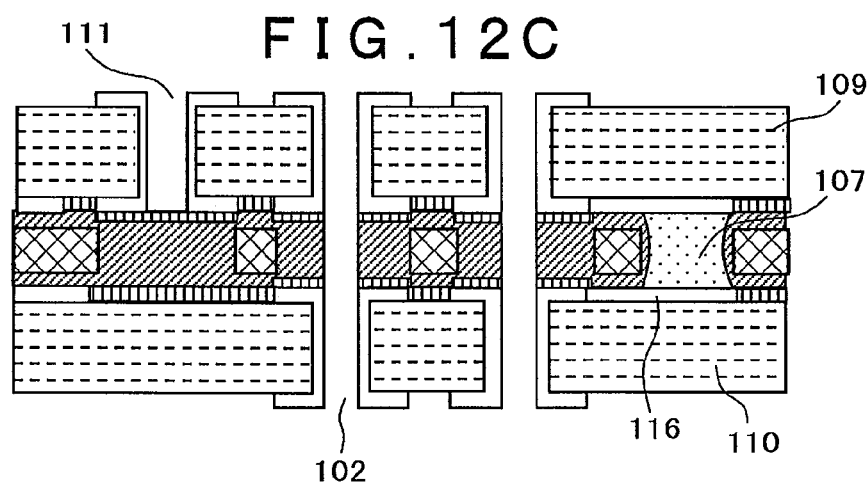

FIGS. 12A to 12C represent the substrate bonding process steps. As FIG. 12A illustrates, the lower multilayer printed wiring board 110, the three-layered sheet 118, and the upper multilayer printed wiring board 109 are disposed in this order in the vacuum thermocompression bonding device while being guided with the positioning pin, which is subjected to thermocompression bonding under the evacuated environment for bonding the substrates as FIG. 12B shows. Finally, the piercing TH 102 is drilled to form the hole, and the interlayer connection substrate with the structure illustrated in FIG. 12C is completed.

If the TH pitch is too narrow to set the bore size of the three-layered sheet to the sufficiently large value, the TH is blocked to allow prevention of the resin adhesion to the TH wall surface.

Fifth Embodiment

Figure 13A:
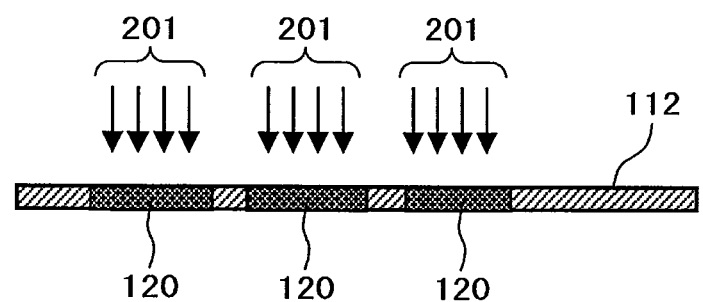
FIGS. 13A to 13C represent the process steps of the three-layered sheet for the adhesive layer between the multilayer substrates according to a fifth embodiment of the present invention.
Figure 13B:
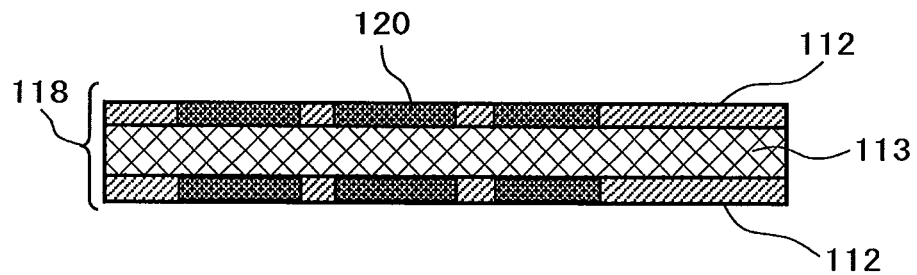
Figure 13C:
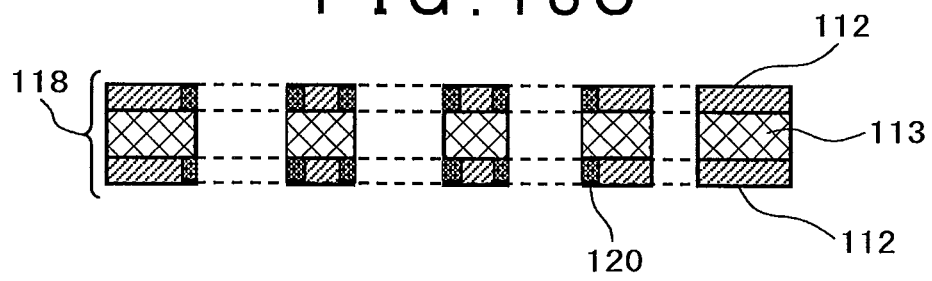

Referring to FIGS. 13A to 13C, an explanation will be made with respect to the method of manufacturing the three-layered sheet which enhances the resin intrusion prevention effect into the TH using the method different from the one described in the second, third and fourth embodiments with respect to the method of manufacturing the interlayer connection substrate as described in the first embodiment.

The prepreg material around the hole to be drilled in the TH of the three-layered sheet 118 is locally heated with laser so as to be preliminarily cured. This makes it possible to enhance the effect for preventing resin intrusion to the TH.

For example, as FIG. 13A illustrates, the prepreg of the region 120 with the diameter larger than the bore size to be drilled in the TH of the three-layered sheet by 0.2 mm or larger is cured through laser irradiation 201.

As FIG. 13B illustrates, positions of the prepreg material 112 and the core material 113 are aligned for the thermocompression bonding. Then like the first embodiment, the TH and the three-layered sheet 118 of the interlayer connection portion are drilled to form the hole as illustrated in FIG. 13C.

It is possible to enhance the effect for preventing the resin intrusion into the TH by using the three-layered sheet having the prepreg material around the TH cured through the aforementioned method in the process illustrated in FIGS. 3A to 3D as described in the first embodiment.

Sixth Embodiment

Referring to FIGS. 14A and 14B, and 15A and 15B, an explanation will be made with respect to the method of preventing shape failure of the interlayer connection portion 107 by forming a dummy hole 122 in the three-layered sheet 118 for homogenization while suppressing flow of the molten resin with respect to the method of manufacturing the interlayer connection substrate as described in the first embodiment.

Figure 14A:
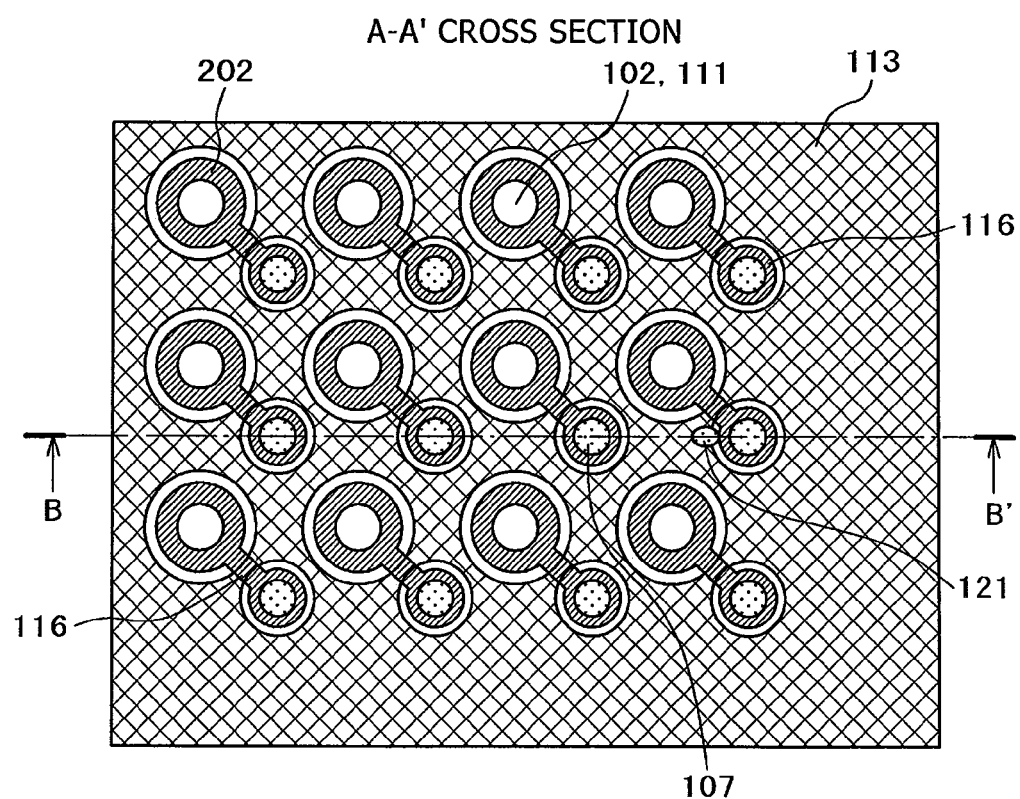
Figure 14B:
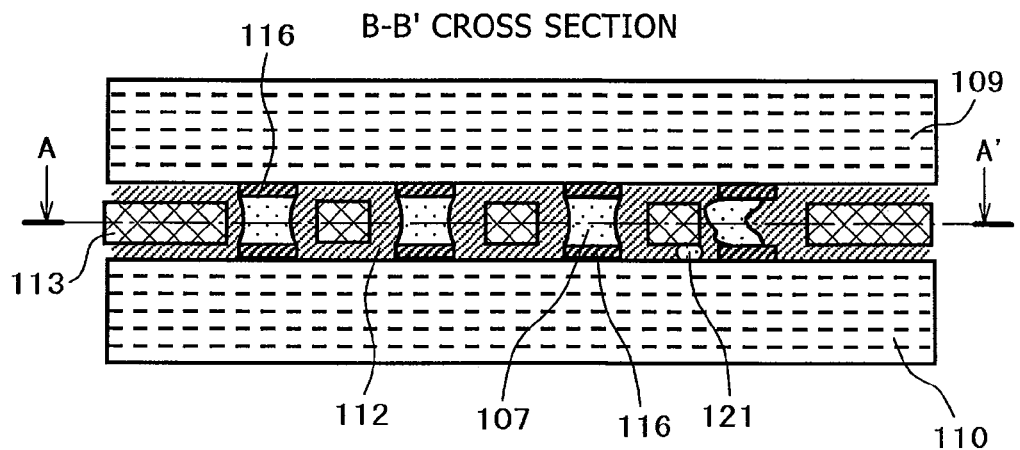

FIG. 14A is a sectional view taken along line A-A' for cutting the region where the THs 102, 111, and the interlayer connection portions 107 densely exist, for example, a mount portion of the press-fit connector 103 of the interlayer connection substrate 101 as described in the first embodiment at the center of the core material 113 between the bonded substrates. FIG. 14B is a sectional view taken along line B-B' for vertically cutting the entire interlayer connection substrate 101 with respect to the cutting line of B-B' shown in FIG. 14A. In the region where the interlayer connection portions 107 and the THs 102, 111 densely exist, the amount of the resin flowing from the outer peripheral direction becomes relatively larger than that of the resin flowing from the center. At the interlayer connection portion 107 around the outer periphery, the solder is forced to flow inward, which may cause an excessive solder 121 owing to the solder flow as illustrated in FIG. 14B.

Figure 15A:
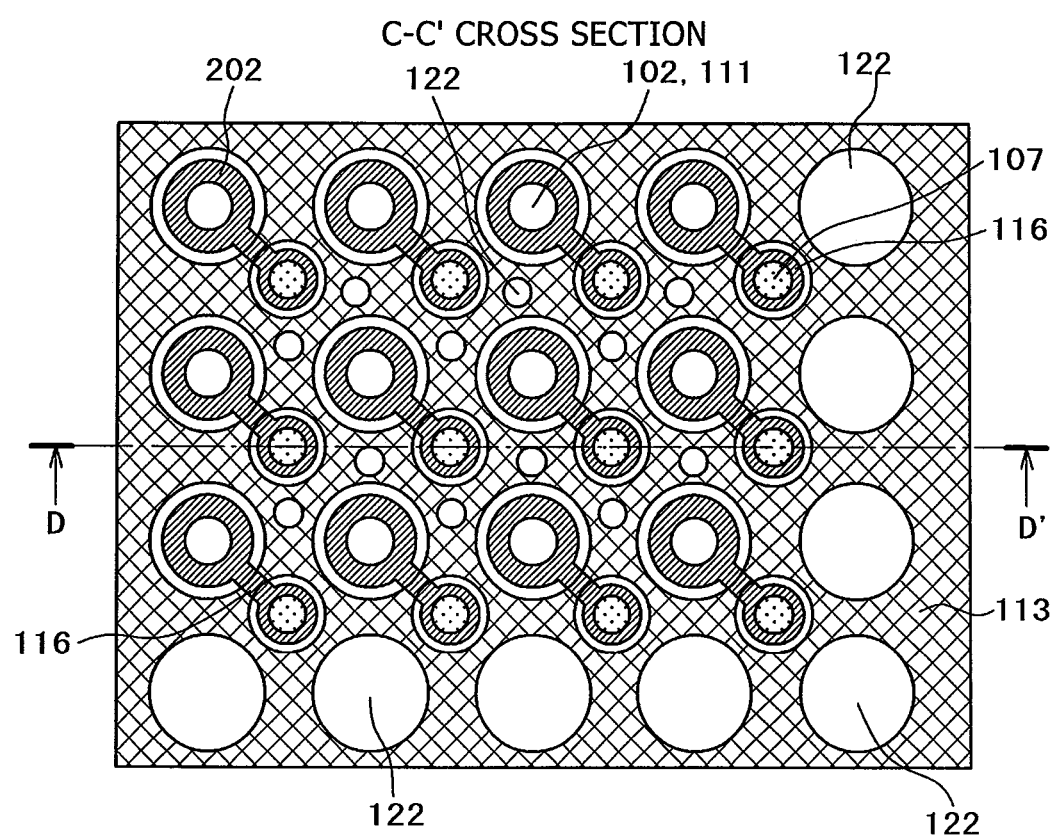
Figure 15B:
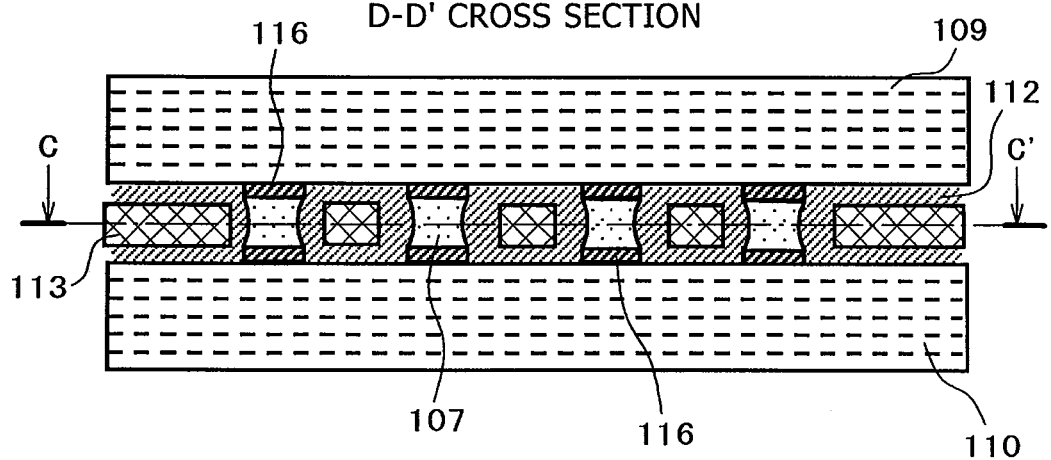
Figure 16A:
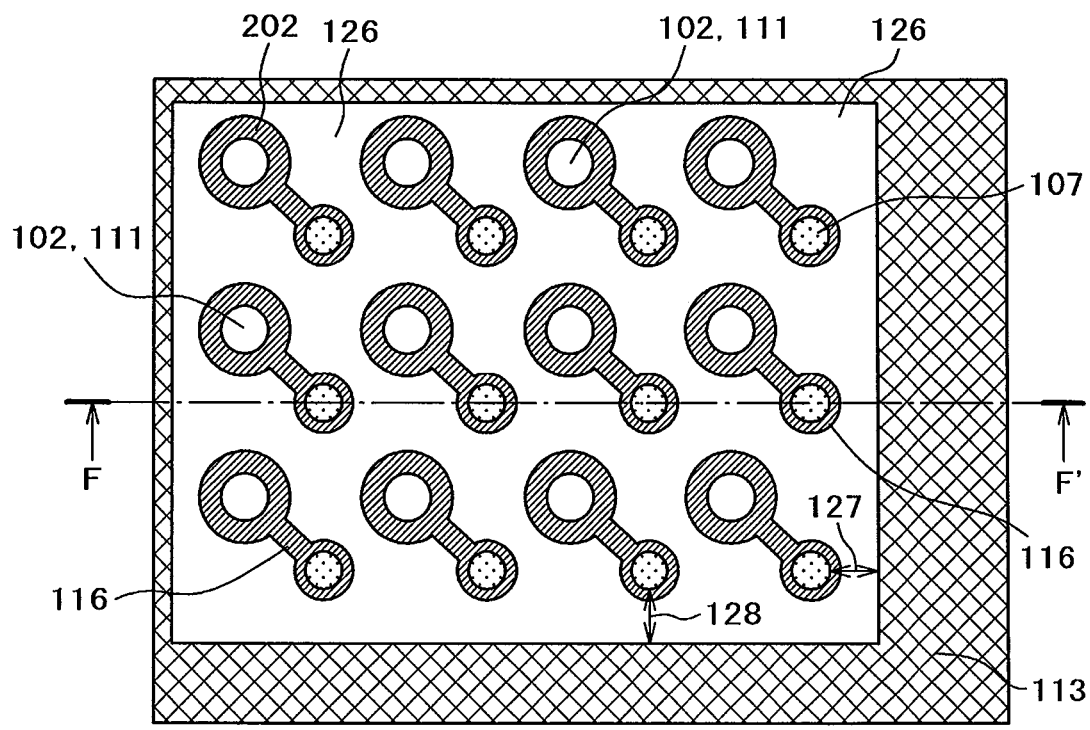
Figure 16B:
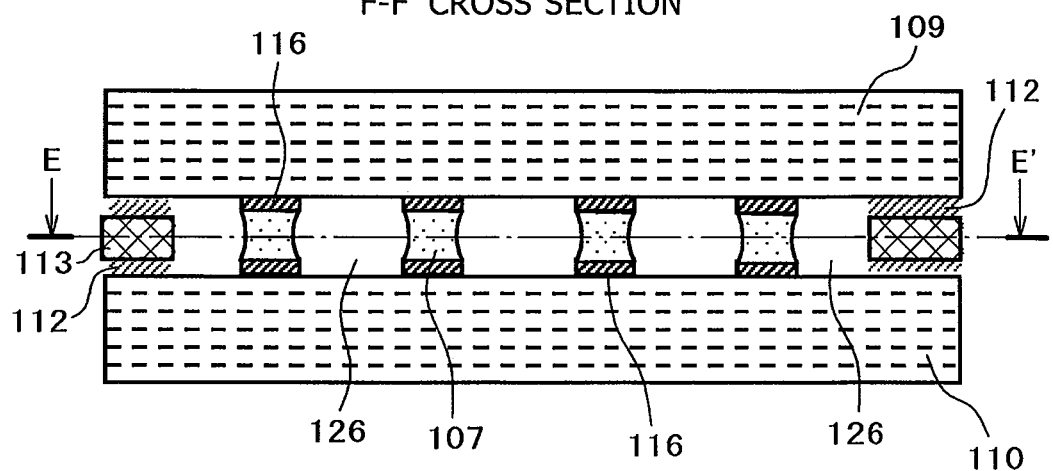

As FIG. 15A illustrates, the dummy hole 122 is formed in the three-layered sheet 118 around the interlayer connection portion 107 at the outer circumference so as to control the amount of resin flowing to the interlayer connection portion 107, and prevent generation of the excessive solder 121. For example, the dummy hole is formed at the outer circumference to have the diameter and the pitch, both of which are the same as those of the hole of the three-layered sheet, which is formed in the TH. It is also effective to form the dummy holes 122 each with small diameter around the interlayer connection portions 107, and the area between the THs 102 and 111.

Seventh Embodiment

Referring to FIGS. 14A, 14B, 16A and 16B, an explanation will be made with respect to the method of preventing the shape failure of the interlayer connection portion 107 by providing a removal area 126 in the three-layered sheet 118 in the method of manufacturing the interlayer connection substrate as described in the first embodiment for preventing the molten resin flow from reaching the interlayer connection portion 107.

FIG. 14A is a sectional view taken along line A-A' for cutting the region of the interlayer connection substrate 101 according to the first embodiment, where the THs 102, 111 and the interlayer connection portions 107 densely exist as the mount portion of the press-fit connector 103 at the center of the core material 113 between the bonded substrates. FIG. 14B is a sectional view taken along line B-B' for vertically cutting the entire interlayer connection substrate 101 with the cutting-plane line of B-B' shown in FIG. 14A. In the region where the interlayer connection portions 107 and the THs 102, 111 densely exist, the amount of resin flowing from the outer circumferential direction becomes relatively larger than the amount of the resin flowing from the center. Therefore, the solder is forced to flow inward at the outer circumferential interlayer connection portion 107. This may cause the excessive solder 121 owing to the solder flow as FIG. 14B illustrates.

In order to prevent the aforementioned phenomenon, space is ensured by removing the three-layered sheet 118 in all or part of the interlayer connection portion of the connection area to suppress the amount of the resin flowing to the interlayer connection portion 107. This makes it possible to prevent connection failure such as the excessive solder 121. For example, it is effective to determine the end of the three-layered sheet removal area 126 to keep the appropriate distance 127 or 128 which is considered to prevent reach of the molten resin from the adjacent prepreg material 112 to the closest interlayer connection portion 107, thus allowing the connection portion such as the solder to be highly reliable.

Each of the distances 127 and 128 may be determined in consideration of the influence of the structure deformed by the temperature change or impact upon actual operation of the product given to reliability of the solder connection portion. In the present embodiment, the resin and the core material are removed, which may cause the concern of deterioration in variation of the characteristic impedance of the signal wiring, and the ion migration. It is therefore preferable to determine with respect to applicability by conducting evaluations of the wiring electric characteristic and the ion migration resistance.

Eighth Embodiment

Referring to FIGS. 17A to 18D, an explanation will be made with respect to the method of enhancing electric properties by forming the interlayer connection portion 107 on the pad 202 for TH in the method of manufacturing the interlayer connection substrate as described in the first embodiment.

Figure 17A:
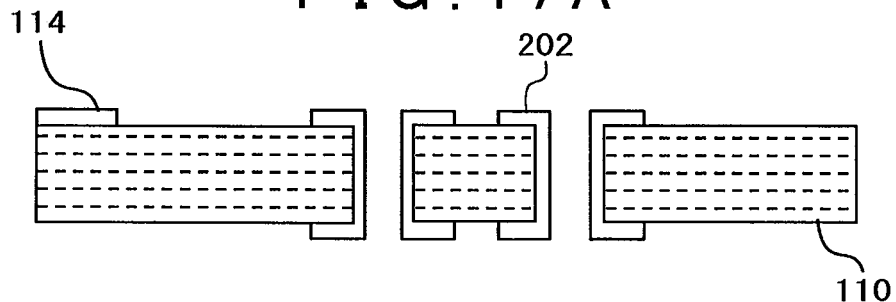
FIGS. 17A to 17D represent the pretreatment process steps of the substrate according to an eights embodiment of the present invention, where the electrode is formed on the area having the TH (or VIA) filled with the insulation material for connecting the solder bumps on the electrode.
Figure 17B:
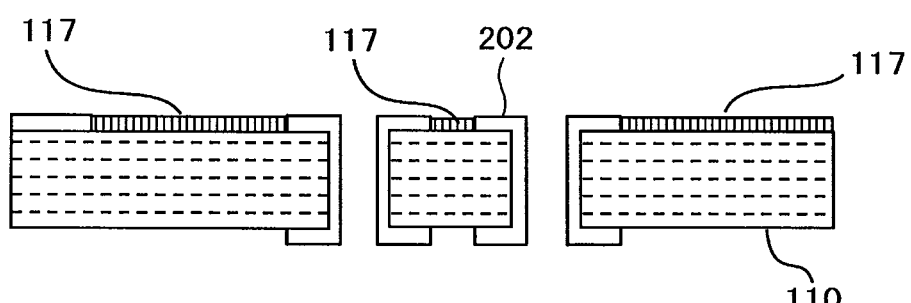

FIGS. 17A to 17D represent the pretreatment process steps of the multilayer printed wiring board 110 to be bonded. The THs used for interlayer connection of the substrates to be bonded are formed in the upper and the lower substrates to face each other. The solder resist 117 is formed on the surface on the bonded surface for planarization like the second embodiment (FIGS. 17A and 17B).

Figure 17C:
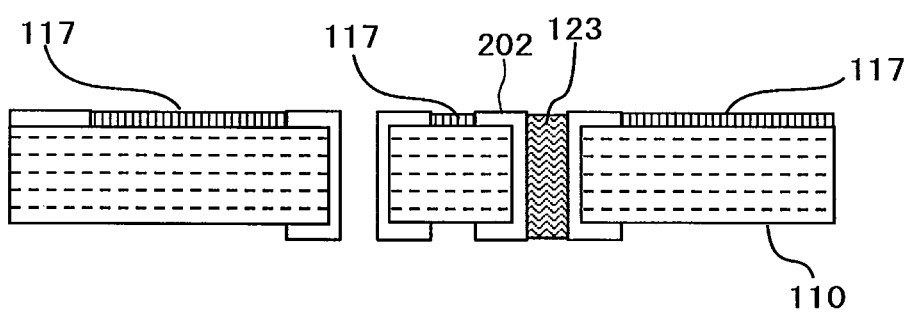

The THs used for the interlayer connection are filled with an insulation resin 123 as FIG. 17C illustrates.

Figure 17D:
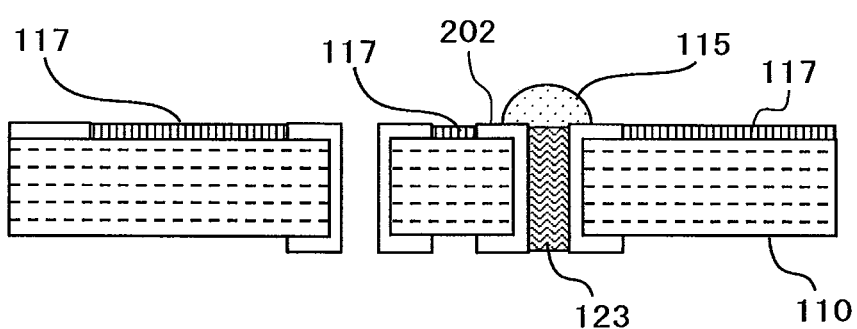

As FIG. 17D illustrates, the solder paste is printed on the pad 202 for TH filled with the insulation resin 123, and the substrate is subjected to the reflow heating process to generate the solder bump 115.

FIGS. 18A to 18D represent the substrate bonding process steps.

Figure 18A:
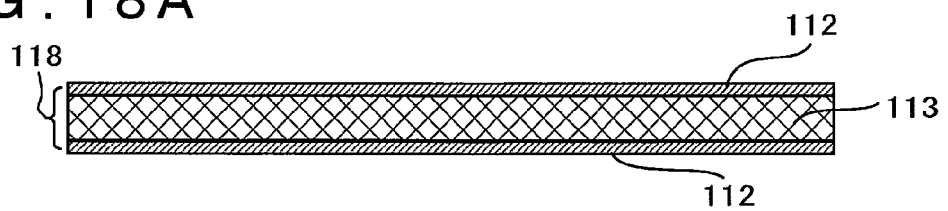
FIGS. 18A to 18D represent the process steps of manufacturing the three-layered sheet for the adhesive layer between the multilayer substrates, and boning the multilayer substrates according to the eights embodiment of the present invention, which are performed on the region where the electrode is formed on the area having the TH (or VIA) filled with the insulation material for connecting the solder bumps on the electrode.
Figure 18B:
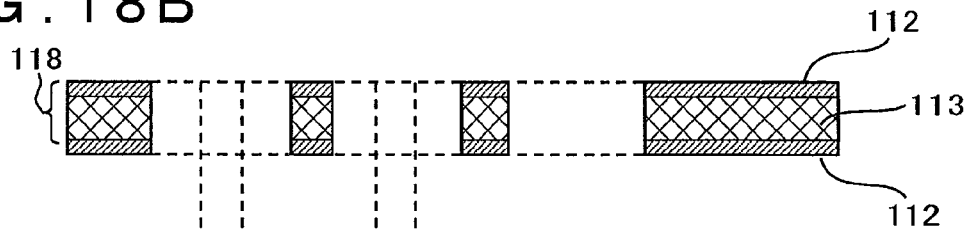
Figure 18C:
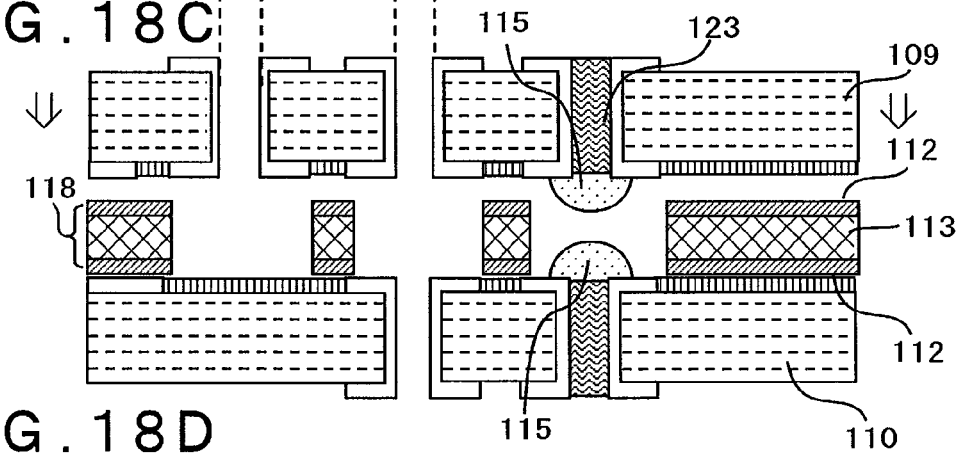
Figure 18D:
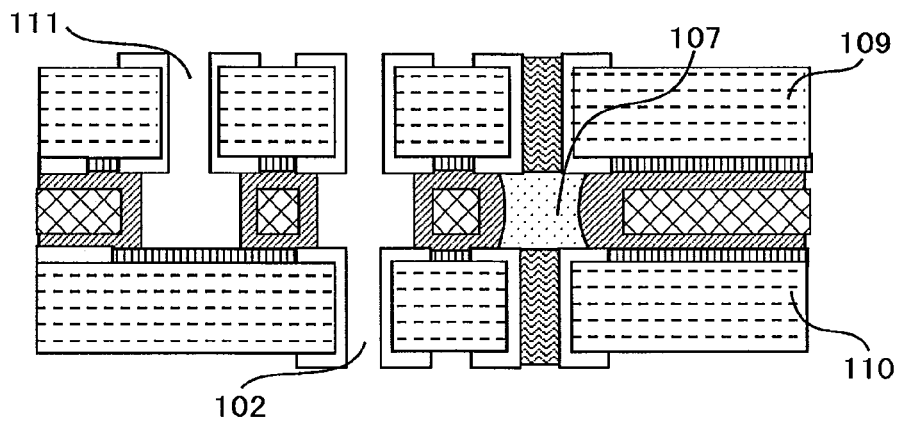

As FIG. 18C illustrates, the lower multilayer printed wiring board 110, any one of the three-layered sheet 118 and the adhesive layer 112, and the upper multilayer printed wiring board 109 are disposed in this order in the vacuum thermocompression bonding device, while being guided with the positioning pin (not shown), which are subjected to the thermocompression bonding under the evacuated environment to complete production of the interlayer connection substrate with the structure illustrated in FIG. 18D.

This makes it possible to improve the signal transmission property by lessening the influence of the discontinuous point of impedance and electrostatic capacity.

Ninth Embodiment

Referring to FIGS. 19A to 19D and 20A to 20D, an explanation will be made with respect to the method of improving electric properties by forming the interlayer connection portions 107 on the pad 202 for TH in the method of manufacturing the interlayer connection substrate as described in the first embodiment.

Figure 19A:
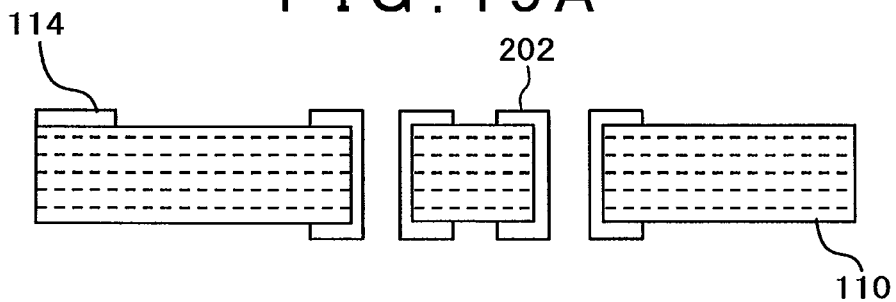
FIGS. 19A to 19D represent the pretreatment process steps of the substrate according to a ninth embodiment of the present invention, where the TH (or VIA) is filled with the insulation material, on which the electrode is formed for electric coupling via the ball having the core formed of such material as metal on the electrode.
Figure 19B:
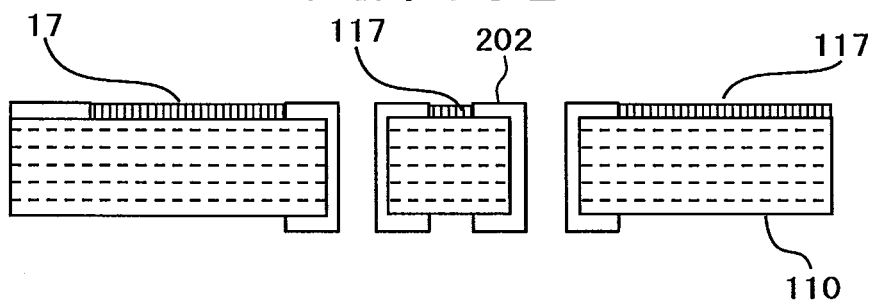
Figure 19C:
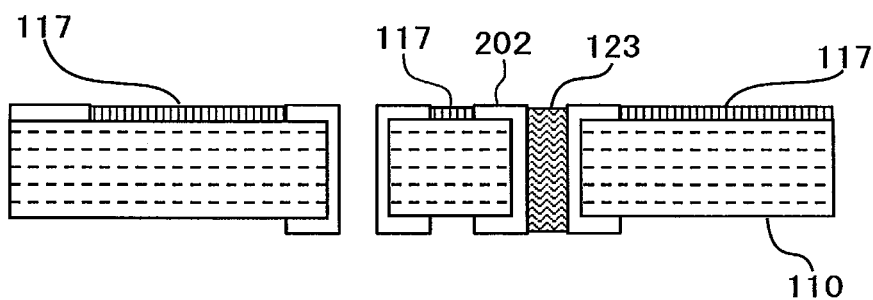

FIGS. 19A to 19D represent the pretreatment process steps of the multilayer printed wiring board 110 to be bonded. The THs used for interlayer connection of the substrates to be bonded are formed in the upper and the lower substrates to face each other. The solder resist 117 is formed on the surface to be bonded like the second embodiment for planarization (FIGS. 19A and 19B).

The THs used for interlayer connection are filled with the insulation resin 123 at the position equal to or slightly lower than the substrate plane.

Figure 19D:
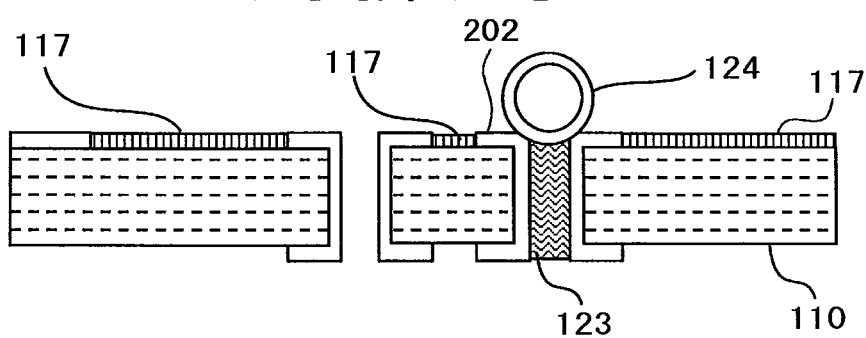

As FIG. 19D illustrates, a metal ball 124 as the connection material such as the Cu core solder plating ball is disposed on the pad 202 for TH filled with the insulation resin 123. In this case, the core diameter of the connection material as the Cu core solder plating ball 124 as the connection material, or the total diameter of the core and the barrier layer such as Ni is characterized to be larger than the TH diameter.

Figure 20A:
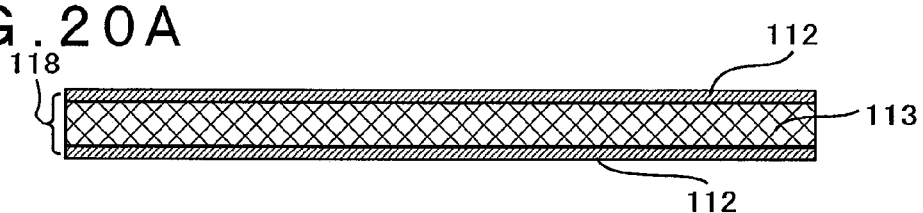
FIGS. 20A to 20D represent the process steps of manufacturing the three-layered sheet for the adhesive layer between the multilayer substrates, and bonding the multilayer substrates, which are performed on the region where the electrode is formed on the area having the TH (or VIA) filled with the insulation material for electric coupling via the ball with the core formed of such material as metal on the electrode according to the ninth embodiment of the present invention.
Figure 20B:
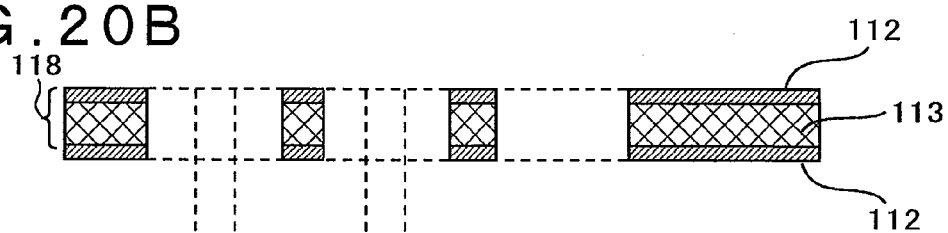
Figure 20C:
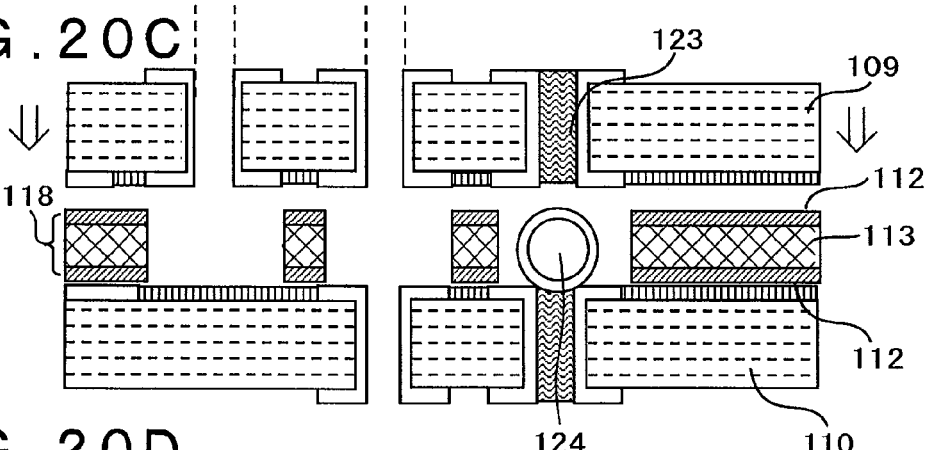
Figure 20D:
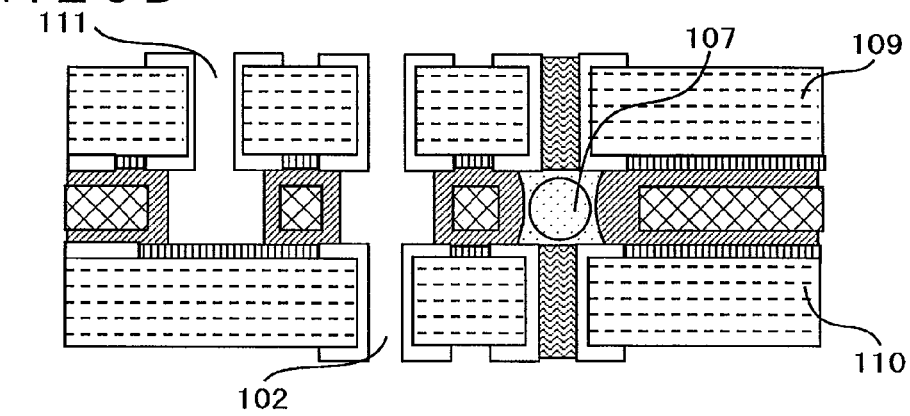

FIGS. 20A to 20D represent the substrate bonding process steps. As FIG. 20C illustrates, the lower multilayer printed wiring board 110, the three-layered sheet 118, the upper multilayer printed wiring board 109 are disposed in this order in the vacuum thermocompression bonding device, while being guided with the positioning pin. They are subjected to the thermocompression bonding under the evacuated environment, and heating to the temperature equal to or higher than the solder melting point of the Cu core solder plating ball through thermocompression bonding. Then the solder is metal bonded to the upper and the lower pads 202 for TH to complete production of the interlayer connection substrate with the structure illustrated in FIG. 20D. This connection structure makes it possible to improve the signal transmission property by lessening influence of the non-continuous point of impedance or the electrostatic capacity.

The core ball connection is allowed to use the metal ball other than CU, the resin core ball, and the one formed of the inorganic material such as ceramic and glass. The surface of the core ball may be plated, or the metal film is applied to the material other than metal. It is also possible to form the paste as the adhesive that contains the metal piece.

Tenth Embodiment

Figure 21A:
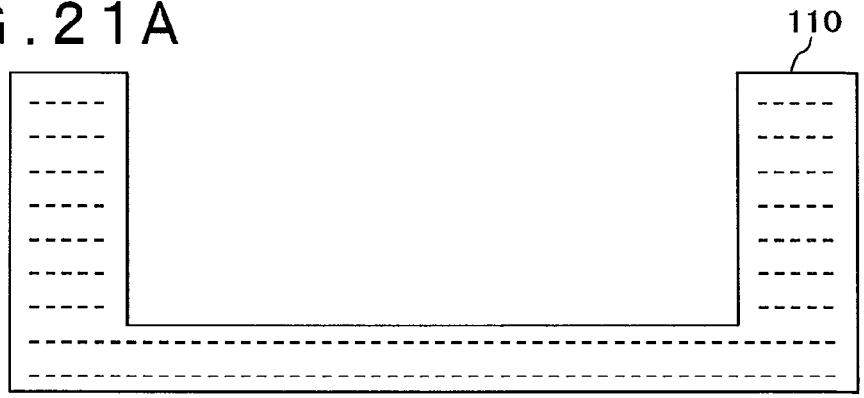
FIGS. 21A to 21C represent an example of the manufacturing process for partially connecting the substrate with another structure through bonding according to a tenth embodiment of the present invention.
Figure 21B:
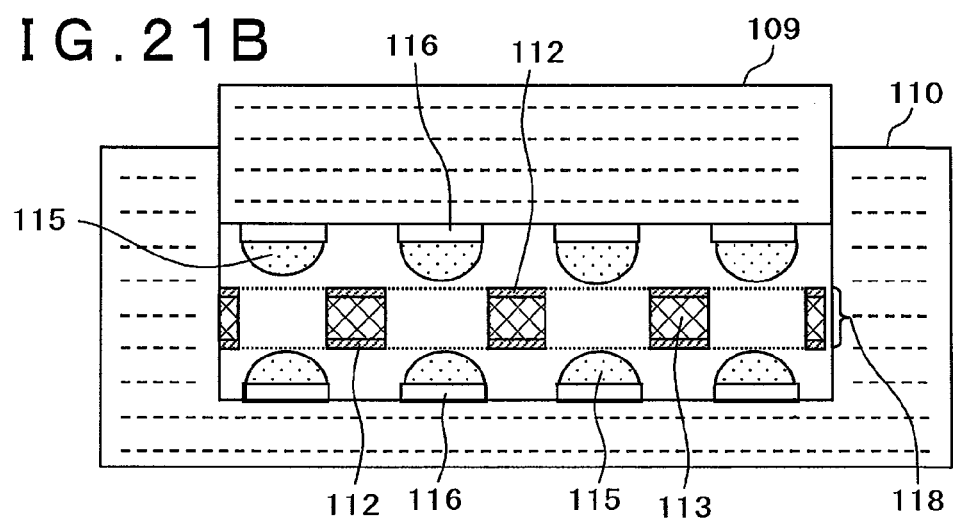
Figure 21C:
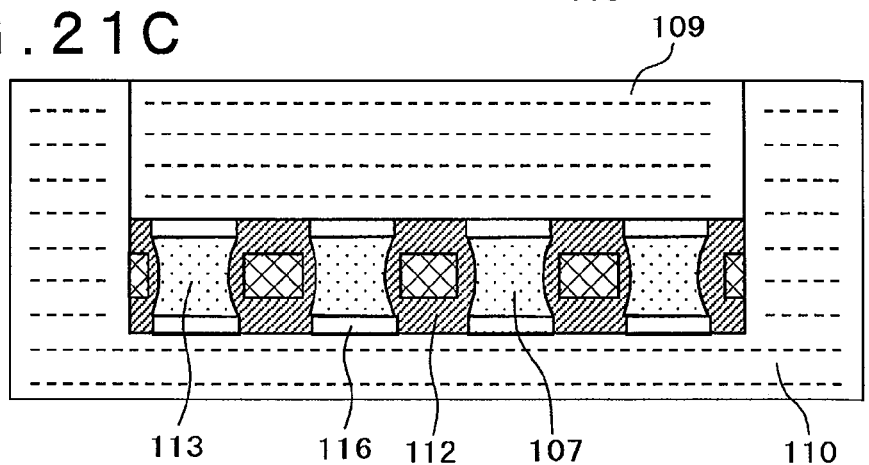

Referring to FIGS. 21A to 21C, an explanation will be made with respect to an example for applying the interlayer connection described in the second embodiment to a part of the substrate requiring high-rate signal wiring. A recess portion as shown in FIG. 21A is formed in the lower multilayer printed wiring board 110 through the router process. Alternatively, the recess portion may be formed as a cavity when producing the printed substrate, ceramic substrate and glass substrate.

As FIG. 21B illustrates, the electrodes 116 are disposed on the upper multilayer printed wiring board 109 and the lower multilayer printed wiring board 110 to face each other. The three-layered sheet 118 and the upper multilayer printed wiring board 109 which are formed to have the same horizontal cross section as that of the recess portion are fitted therewith. They are subjected to batch thermocompression bonding with the vacuum thermocompression bonding device to manufacture the interlayer connection substrate as illustrated in FIG. 21C.

The aforementioned structure ensures reduction in the substrate material cost by using FR-4 that is the general base material for forming the lower printed wiring board 110, and the low dielectric loss material suitable for high-rate signal transmission for forming the upper printed wiring board 109.

The electrodes may be connected using the solder bump formed with the solder paste, the metal ball such as the Cu core solder ball, the Cu core ball fixed with the solder paste, the metal-containing adhesive paste such as Ag paste, or an arbitrary combination thereof. The present embodiment presents the case having the cavity processed in the lower printed wiring board. Besides the use of the cavity, the upper multilayer printed wiring board may be mounted on the stepped area partially formed in the lower multilayer printed wiring board.

Eleventh Embodiment

Referring to FIGS. 4A to 4C, and 22A and 22B, an explanation will be made with respect to the method of bonding three or more substrates in the method of manufacturing the interlayer connection substrate as described in the second embodiment. The manufacturing method in the aforementioned case may be designed to collectively press the three substrates like the method described in the second embodiment, or press the third and subsequent substrates to the two or more bonded substrates. Alternatively, arbitrary combination of the above process steps is available.

All the plural substrates may be bonded, or partially bonded. The THs and the electrodes used for interlayer connection of the upper and the lower substrates to be bonded are formed to face one another, or formed at arbitrary required positions. Like the second embodiment, the solder resist 117 is formed on the surface to be bonded for planarization (FIGS. 4A and 4B).

The electrodes 116 are preliminarily formed on the upper and the lower substrates to be bonded to face each other. Those electrodes 116 may be formed on the THs for the interlayer connection filled with the insulation resin 123. The solder bump 115 is formed on the thus formed electrode 116 through the solder paste printing as FIG. 4C illustrates.

Figure 22A:
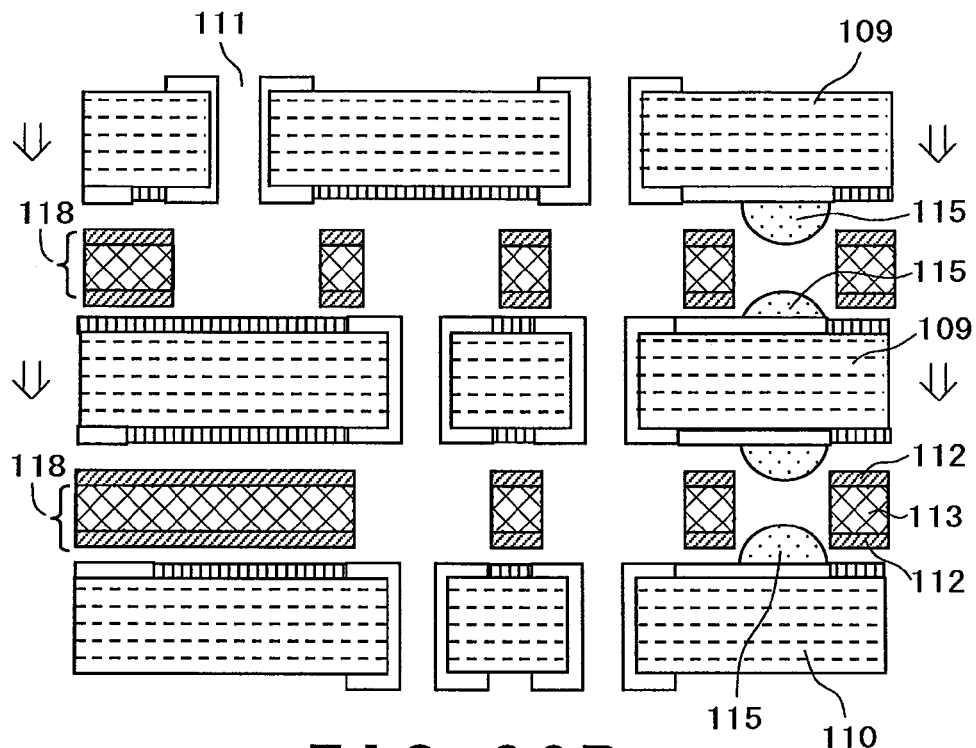
FIGS. 22A and 22B represent the manufacturing process steps for batch bonding of three or more substrates according to an eleventh embodiment of the present invention.
Figure 22B:
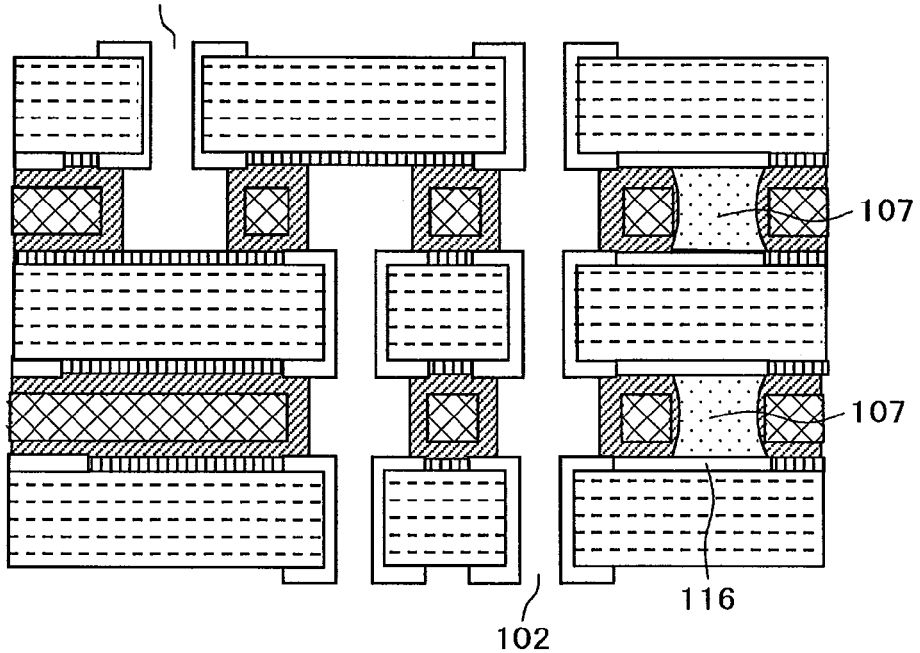

FIGS. 22A and 22B represent the process steps of bonding three multilayer substrates. As FIG. 22A illustrates, plural substrates, that is, three or more substrates of the lower multilayer printed wiring board 110, the three-layered sheet 118 and the upper multilayer printed wiring board 109 are laminated in this order, and disposed in the vacuum thermocompression bonding device while being guided with the positioning pin. They are thermocompression bonded under the evacuated environment to complete production of the interlayer connection substrate with the structure as FIG. 22B illustrates.

FIGS. 22A and 22B show the use of solder for connecting the electrodes through interlayer connection of three or more laminated substrates in the present embodiment. However, it is possible to use the Cu core solder plating ball, any other metal-containing paste, Au bump and solder, Cu pillar (protrusion) and solder, and Cu pillar (protrusion) and the metal-containing paste may be used.

Twelfth Embodiment

Figure 23A:
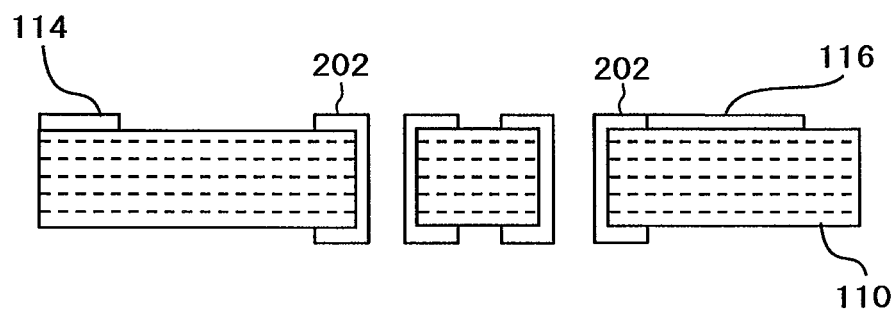
FIGS. 23A to 23C represent the pretreatment process steps of the substrate when using the core ball such as metal and Cu core solder plating ball for interlayer connection of the multilayer substrate according to a twelfth embodiment of the present invention.
Figure 23B:
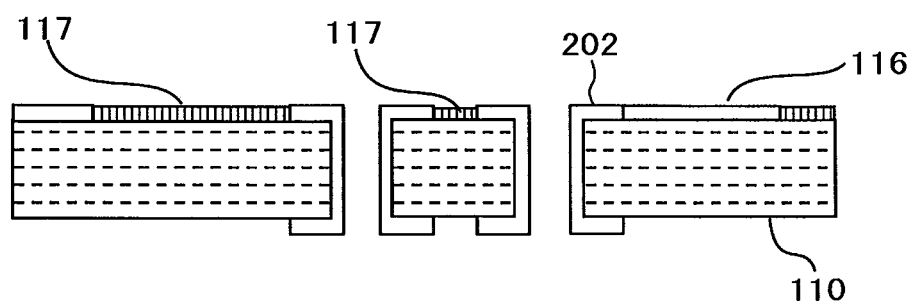
Figure 23C:
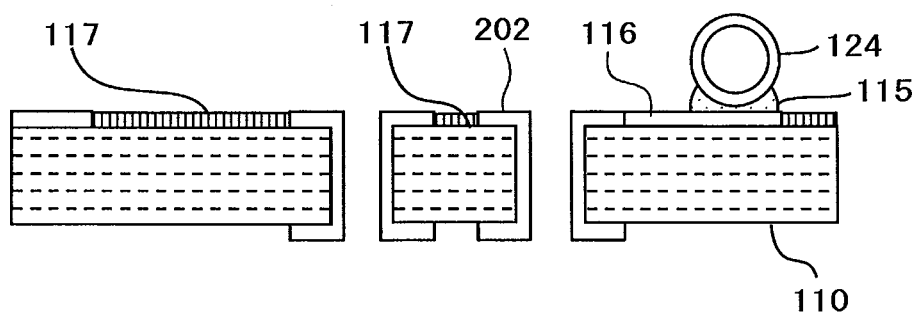

Referring to FIGS. 23A to 23C, 24A and 24B, an explanation will be made with respect to the case for applying the Cu core solder plating ball to the interlayer connection portion 107 in the method of manufacturing the interlayer connection substrate as described in the second embodiment. FIGS. 23A to 23C represent the pretreatment process steps of the multilayer printed wiring board to be bonded. The electrodes 116 used for interlayer connection of the substrates to be bonded are formed on the upper and the lower substrates to face each other. The solder resist pattern 117 is formed on the surface to be bonded like the second embodiment for planarization (FIGS. 23A and 23B).

Referring to the lower printed wiring board 110 as shown in FIG. 23C, the solder is printed on the electrode 116 drawn from the pad 202 for TH. The ball 124 is dropped into the drilled hole of the mask for mounting the ball so as to be disposed on the electrode 116, and subjected to the reflow into the shape of the bump 115. The upper printed wiring board 109 is formed into the solder bump 115 on the electrode 116 through the solder paste printing.

Figure 24A:
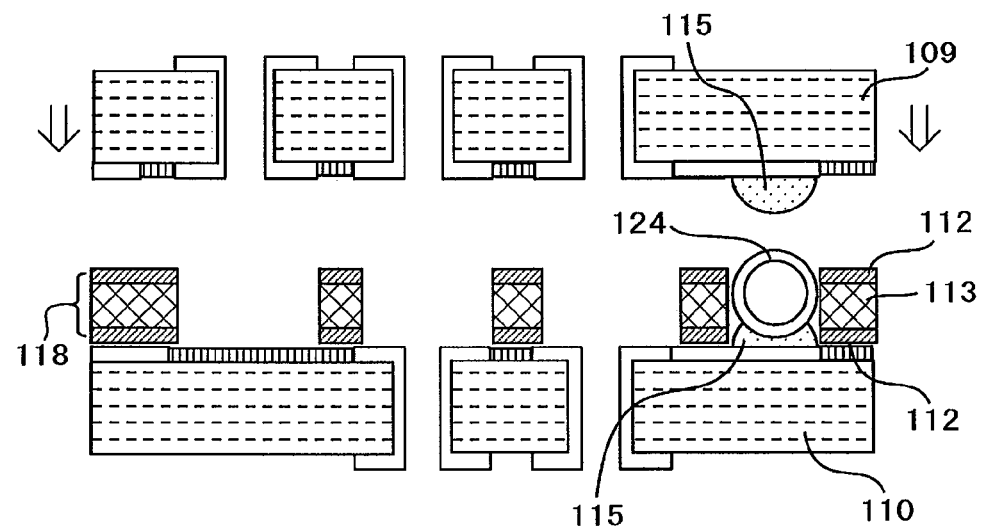
FIGS. 24A and 24B represent the substrate bonding process steps performed when using the core ball such as metal and the Cu core solder plating ball for interlayer connection of the multilayer substrates according to the twelfth embodiment of the present invention.
Figure 24B:
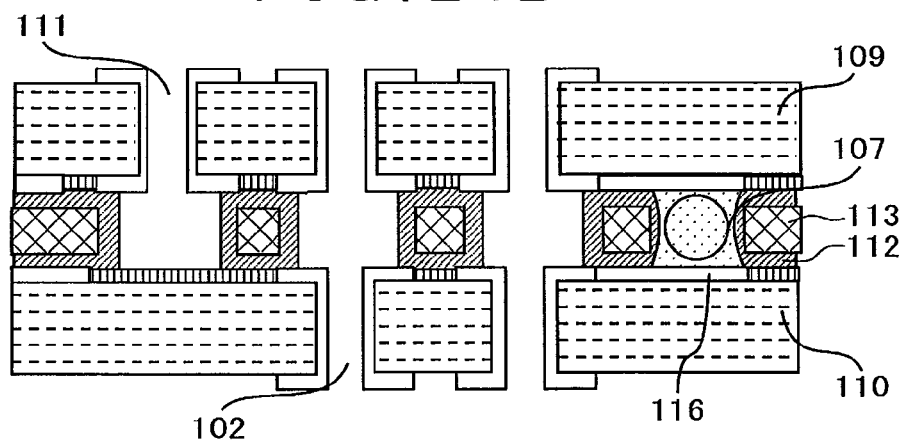

FIGS. 24A and 24B represent the substrate bonding process steps. As FIG. 24A illustrates, the lower multilayer printed wiring board 110, the three-layered sheet 118 and the upper multilayer printed wiring board 109 are disposed in this order in the vacuum thermocompression bonding device while being guided with the positioning pin, and thermocompression bonded under the evacuate environment. The production of the interlayer connection substrate with the structure as illustrated in FIG. 24B is completed.

The use of the Cu core solder plating ball 124 and the solder bump 115 are batch thermocompression bonded to form the hourglass-like interlayer connection portion 107 with high reliability. In this case, the core ball connection may be made using any metal (Ni, Al, Au, Pt, Pd) other than Cu, or inorganic material such as resin core ball, ceramic, glass and the like. The surface of the core ball may be plated. The metal film may be applied to the surface of the core ball formed of the material other than metal. The metal-containing paste may be used for the adhesive. In addition to the ball shape, the core may be fabricated by combining the pillar (protrusion) and solder, and the pillar (protrusion) and the metal-containing paste.

Thirteenth Embodiment

Referring to FIGS. 25A, 25B, 26, and 27, an explanation will be made with respect to an exemplary structure of the substrate requiring the high-rate signal wiring, to which the interlayer connection described in the first embodiment is applied.

Figure 25A:
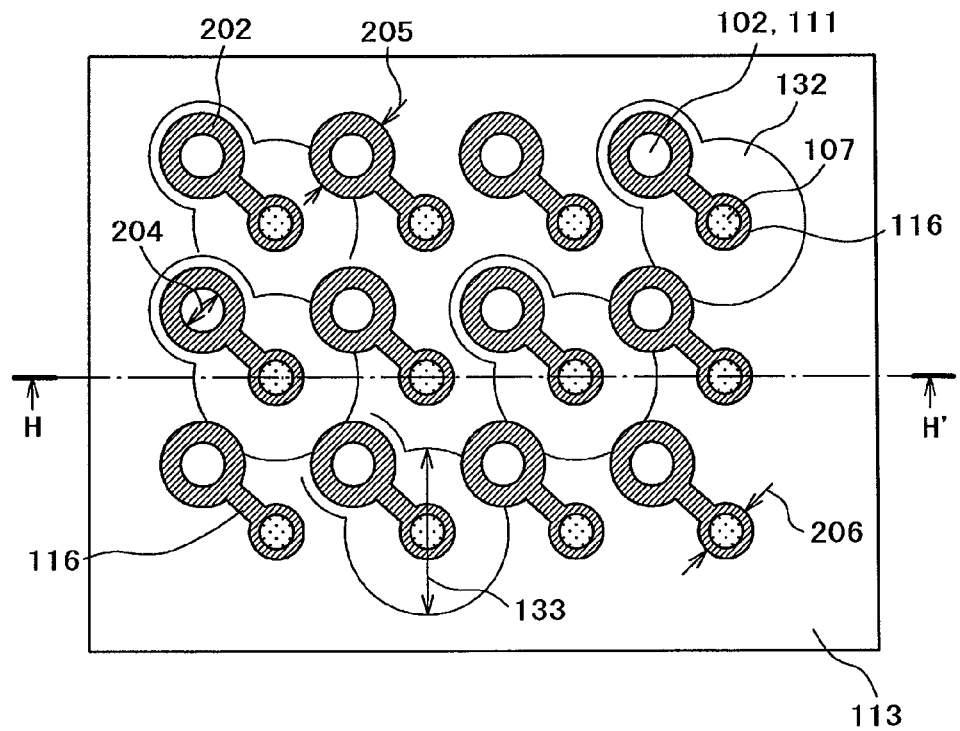

FIG. 25A is a sectional view taken along line G-G' for horizontally cutting the region of the interlayer connection substrate 101 according to the first embodiment, where the THs 102, 111 and the interlayer connection portions 107 densely exist like the mount portion of the press-fit connector 103. A region 132 that includes the peripheral areas of the interlayer connection portion 107 and the THs 102, 111 as the shape of two connected arcs represents that the hollow part of a ground layer 131 that is the closest to the bonded surface of the lower multilayer printed wiring board 110 (FIG. 25B represents the hollowing of the ground layer 131 as the region with the same shape that is the closest to the bonded surface of the upper multilayer printed wiring board 109.).

Figure 25B:
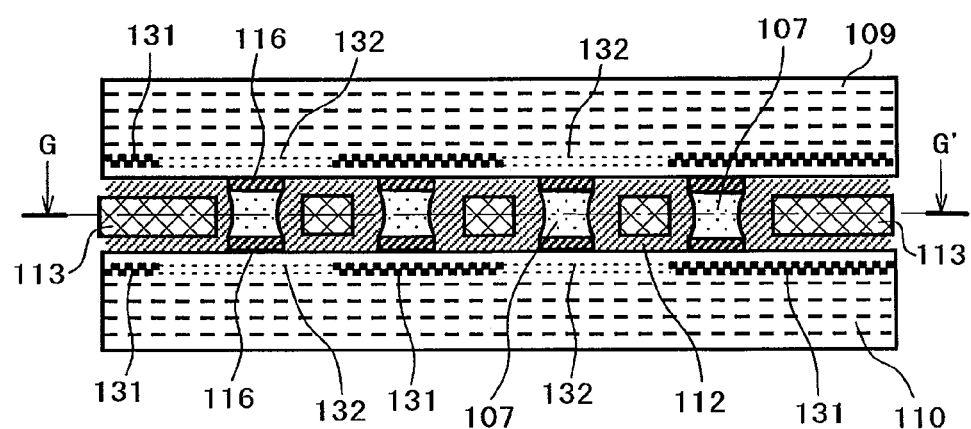

The region 132 as shown in FIGS. 25A and 25B is formed by hollowing the ground layer 131 that is the closest to the respective electrodes 116 of the upper multilayer printed wiring board 109 and the lower multilayer printed wiring board 110 into the circular shape having the solder connection electrode (interlayer connection portion 107) as the center. This makes it possible to reduce the reflection loss caused by reflection owing to the load capacity between the electrode 116 formed on the bonded surface and the ground layer 131 before hollowing.

For example, the electromagnetic field analysis is conducted to the wiring structure of the solder connection and the Cu core solder plating ball connection to calculate the reflection property with respect to the 20 [ps] pulse wave at 14 Gbps as described below. The pulse wave passes through the TH of the upper multilayer printed wiring board, and reaches the TH of the lower multilayer printed wiring board via the connection electrode under the conditions where TH diameter 204=Φ0.3 mm, outer layer electrode diameter 205=Φ0.7 mm, and the connection electrode pad diameter 206=Φ0.7 mm, for example. TDR (Time Domain Reflectometry: characteristic impedance measurement method) waveforms of the TH connection substrate and the Cu core ball connection bonded substrate in inputting the pulse are measured.

Figure 26:
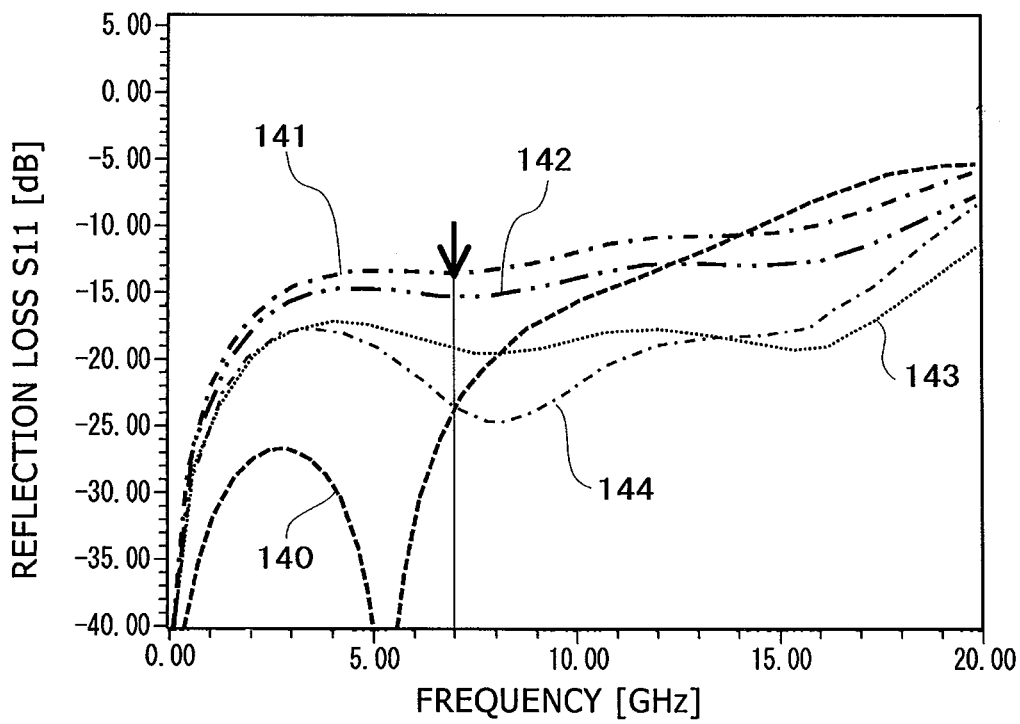
FIG. 26 is a view representing a relationship between the diameter of the area with the hollowed ground layer that is the closest to the electrode of the substrate, and signal quality (reflection loss) as shown in FIGS. 25A and 25B.

FIG. 26 represents measurement results with respect to the reflection characteristic.

Curves 140, 141, 142, 143 and 144 will be described as follows. The curve 140 represents the reflection loss characteristic derived from the normal TH connection as reference. The curve 141 represents the reflection loss characteristic derived from the case where the hollow diameter of the ground layer is 0.4 mm. The curve 142 represents the reflection loss characteristic derived from the case where the hollow diameter of the ground layer is 0.8 mm. The curve 143 represents the reflection loss characteristic derived from the case where the hollow diameter of the ground layer is 1.6 mm. The curve 144 represents the reflection loss characteristic derived from the case where the hollow diameter of the ground layer is 2.4 mm. As described in the present embodiment, hollowing of the ground layer 131 suppresses reduction of the characteristic impedance supposed to be caused by the load capacity at the connected part.

Figure 27:
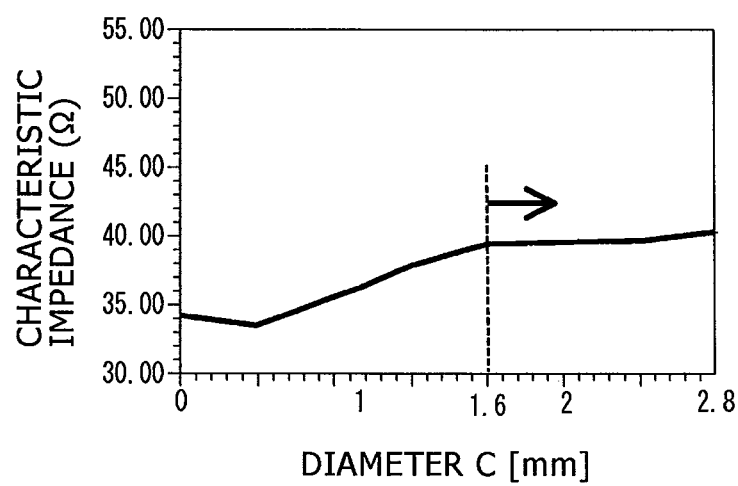
FIG. 27 is a view representing a relationship between the diameter of the area with the hollowed ground layer that is the closest to the electrode of the substrate as shown in FIGS. 25A and 25B, and the characteristic impedance.

FIG. 27 represents the relationship between the hollow diameter (C) 133 of the ground layer 131 and the characteristic impedance (peak value that appears around 120 [ps]). The characteristic impedance value increases along with the increase in the value of the diameter (C). However, the value starts saturating at the certain diameter, 1.6 mm in this case. It is confirmed that hollowing of the ground layer 131 with the diameter equal to or larger than such value improves the transmission characteristic.

The use of the hollow shape 132 of the ground layer 131 is a mere example. The characteristic impedance value varies depending on the distance between the interlayer connection portion 107 and the ground layer 131, and the wiring structure such as the wiring metal layer thickness. Therefore, the optimum shape is determined without limitation. It is not limited to the circular shape, and may be formed into the optimum shape. Although the ground layer 131 is formed as the solid layer such as the voltage plane, similar hollowing may improve the transmission characteristic.

What is claimed is:

1. A method of manufacturing an interlayer connection substrate comprising: providing a first electrode electrically connected to a first pad for a first piercing through hole (TH) on a bonded surface of a first multilayer substrate having the first piercing TH and a first solder bump formed on the first electrode; providing a second electrode electrically connected to a second pad for a second piercing TH on a bonded surface of a second multilayer substrate having the second piercing TH at a position opposite the first electrode and a second solder bump formed on the second electrode; forming holes in a three-layered sheet derived from applying an adhesive as a resin material that is not completely cured to both surfaces of a core material as a cured resin at positions corresponding to the THs and the solder bumps on the electrodes, respectively; and disposing the first and the second multilayer substrates having the respective bonded surfaces facing each other and the three-layered sheet positioned and interposed therebetween, and executing a batch thermocompression bonded through a process of heating and pressing under a vacuum environment to laminate the first multilayer substrate, the second multilayer substrate and the three-layered sheet together, wherein the THs are further drilled to remove resin which flows into the THs after the batch thermocompression bonding process.

2. The method of manufacturing an interlayer connection substrate according to claim 1, wherein the bonded surfaces of the first and the second multilayer substrates are planarized by applying solder resists and executing a process of exposure and developing; and the holes are formed in the three-layered sheet at positions corresponding to the THs, which have a diameter larger than a diameter of the THs.

3. The method of manufacturing an interlayer connection substrate according to claim 2, wherein a ring-like bank-shaped pattern is formed on each of the pads for the THs of the bonded surfaces of the first and the second multilayer substrates using the solder resist in the planarizing process with the solder resist; and the holes are formed in the three-layered sheet at positions corresponding to the THs, which have a diameter larger than a diameter of the THs, and a hole is further formed in the adhesive, which has a diameter larger than a diameter of a hole formed in the core material.

4. The method of manufacturing an interlayer connection substrate according to claim 2, wherein the planarizing process is executed through the process of exposure and developing by applying the solder resist to the bonded surfaces of the first and the second multilayer substrates to cover the THs through the process of exposure and developing by bonding a sheet type solder resist.

5. The method of manufacturing an interlayer connection substrate according to claim 2, wherein THs of the first and the second multilayer substrates are partially used for interlayer connection, which are filled with an insulation resin so that the solder bumps are formed by printing a solder paste on the pads for the THs.

6. The method of manufacturing an interlayer connection substrate according to claim 5, wherein the first multilayer substrate has a metal ball as a Cu core solder plating ball mounted on each of the pads for the THs, which is bonded to the second multilayer substrate either having or not having the solder bump formed on the pads for the THs.

7. The method of manufacturing an interlayer connection substrate according to claim 2, wherein a Cu core solder plating ball is provided to form each of the solder bumps after printing a solder on the first and second electrodes through a solder paste printing.

8. The method of manufacturing an interlayer connection substrate according to claim 1, wherein areas of the bonded three-layered sheet at positions corresponding to the THs, having a diameter larger than a diameter of the THs are locally heated with laser to be preliminarily cured to form holes at positions corresponding to the THs and the solder bumps on the electrodes.

9. The method of manufacturing an interlayer connection substrate according to claim 1, wherein dummy holes for suppressing and homogenizing a molten resin flow are formed in the three-layered sheet in a region where the THs and interlayer connection portions densely exist at a position surrounding the interlayer connection portion located at an outer circumference, or a position between the interlayer connection portion and the THs.

10. The method of manufacturing an interlayer connection substrate according to claim 1, wherein in a region where the THs and interlayer connection portions densely exist, a removal area is formed in the three-layered sheet to prevent a flow of a molten resin from reaching the interlayer connection portion; and a boundary of the removal area is set to secure an appropriate distance considered to prevent reach of the molten resin from a peripheral prepreg material to the closest interlayer connection portion.

11. The method of manufacturing an interlayer connection substrate according to claim 1, wherein a recess portion or a stepped portion is processed in the first multilayer substrate so that the first electrode connected to the first pad for the first TH requiring electric conduction is provided on a bottom surface of the recess portion or the bonded surface of the stepped portion, and the first solder bump is formed on the first electrode; and the second electrode connected to the second pad for the second TH is formed on the bonded surface of the second multilayer substrate having the second piercing TH processed to have an outer shape corresponding to the bonded surface of the first multilayer substrate at a position opposite the first electrode formed on the first multilayer substrate so that the second solder bump is formed on the second electrode.

12. The method of manufacturing an interlayer connection substrate according to claim 1, wherein an upper electrode connected to an upper pad for a third piercing TH is formed on a first bonded surface of a third multilayer substrate having the third piercing TH at a position opposite the first or second electrode and an upper solder bump formed on the upper electrode, and a lower electrode connected to a lower pad for the third piercing TH is formed on a second bonded surface of the third multilayer substrate at a position opposite the first or second electrode and a lower solder bump formed on the lower electrode; and the first and the second multilayer substrates, and one or more third multilayer substrates are provided having the respective bonded surfaces facing each other, and the three-layered sheets are positioned and laminated between the substrates, which are batch thermocompression bonded through a process of heating and pressing under an evacuated environment.

13. The method of manufacturing an interlayer connection substrate according to claim 1, wherein the solder is selected from any one of Sn-56 3Ag-0.5Cu solder, Sn base, Sn—Ag—Cu base, low Ag base, Sn—Cu base, Sn—Ag—Bi base, Sn—In base, Sn—Zn base, Pb-free solder, and Pb-containing solder; the adhesive for the three-layered sheet is a B stage material formed by impregnating a glass fiber in a thermosetting resin; and the batch thermocompression bonding process of the plural multilayer substrates makes a transition from a temporary pressing for interposing the substrate to a main pressing at a stage where the temperature reaches the melting point of the solder from start of heating under the evacuated environment so that a gap between the multilayer substrates is filled with a molten resin.

14. The method of manufacturing an interlayer connection substrate according to claim 1, wherein the solder is selected from any one of Sn-58Bi solder, Sn—IAg-57Bi solder, Sn base, Sn—Bi base, Sn—Ag—Cu base, Sn—Ag base including low Ag base having Ag content lower than 3.0 wt %, Sn—Cu base, Sn—Ag—Bi base, 20 Sn—Zn base, Pb-free solder, and Pb-containing solder; the adhesive for the three-layered sheet is a B stage material formed by impregnating a glass fiber in a thermosetting resin; and the batch thermocompression bonding process of the plural multilayer substrates makes a transition from a temporary pressing for interposing the substrate to a main pressing at a stage where the temperature is increased by heating to reach a resin curing temperature, which is retained under the evacuated environment, and fills a gap between the multilayer substrates with the molten resin.

* * * * *